United States Patent [19]

Israelsen

[11] Patent Number: 5,172,228
[45] Date of Patent: Dec. 15, 1992

[54] IMAGE COMPRESSION METHOD AND APPARATUS EMPLOYING DISTORTION ADAPTIVE TREE SEARCH VECTOR QUANTIZATION

[75] Inventor: Paul D. Israelsen, North Logan, Utah

[73] Assignee: Utah State University Foundation, Logan, Utah

[21] Appl. No.: 794,516

[22] Filed: Nov. 19, 1991

[51] Int. Cl.⁵ .............................................. H04N 7/13
[52] U.S. Cl. ....................................... 358/133; 358/86
[58] Field of Search .................................. 358/133, 86

[56] References Cited

U.S. PATENT DOCUMENTS

| | | | |
|---|---|---|---|
| 4,558,350 | 12/1985 | Murakami | 358/21 |
| 4,560,977 | 12/1985 | Murakami et al. | 341/118 |
| 4,878,230 | 10/1989 | Murakami | 358/136 |
| 4,951,139 | 8/1990 | Hamilton et al. | 358/135 |
| 4,954,892 | 9/1990 | Asai et al. | 358/133 |
| 4,979,039 | 12/1990 | Kisor | 358/133 |
| 5,010,401 | 4/1991 | Murakami et al. | 358/133 |
| 5,021,971 | 6/1991 | Lindsay | 358/133 |
| 5,031,037 | 7/1991 | Israelsen | 358/133 |
| 5,067,152 | 11/1991 | Kisor et al. | 380/10 |
| 5,068,723 | 11/1991 | Dixit et al. | 358/133 |

OTHER PUBLICATIONS

"Vector Quantization of Digital Images", Baker, Richard L., Stanford University-University Microfilms International, *UMI Dissertation Information Service*, (Copyright, 1984).

"Vector Quantization", Gray, Robert M., *The Institute of Electrical and Electronics Engineers, Inc., ASSP Mag.*, vol. 1, pp. 4-29, Apr., 1984.

"Variable Rate Vector Quantization of Images", Riskin, Eve A., *Dissertion submitted to the Dept. of Electrical Engineering-Stanford University*, May, 1990.

U.S. Patent Application Serial No. 365,940 entitled "Method and Apparatus for Data Compression with Reduced Distortion" Filed: Jun. 13, 1989.

"Image Compression Using Adaptive Vector Quantization", Goldberg, M., et al., *IEEE Trans. Commun.*, vol. COM-34, pp. 180-187, Feb., 1986.

"Pruned Tree-Structured Vector Quantization in Image Coding", Riskin, Eve A., et al., *Information Systems Laboratory*, Stanford University.

"Variable-Rate Multi-Stage Vector Quantization For Image Coding" Ho, Yo-Sung and Gersho, Allen, *Department of Electrical and Computer Engineering*, University of CA.

"Image Compression Methods With Distortion Controlled Capabilities", Markas, T. and Reif, J., *Department of Electrical Engineering*, Duke University, Durham, NC.

"Variable Rate Vector Quantization For Medical Image Compression", Riskin, Eve A., Lookabaugh, T. et al., *IEEE Trans. on Medical Imaging*, vol. 9, No. 3, Sep., 1990.

*Primary Examiner*—Howard W. Britton
*Attorney, Agent, or Firm*—Woodcock Washburn Kurtz Mackiewicz & Norris

[57] ABSTRACT

A variable rate vector quantization method employs a tree structured codebook. The level of the codebook from which codevectors are selected is determined by a threshold. The threshold varies according to the fullness of a buffer which stores vector quantized data to be transmitted.

82 Claims, 9 Drawing Sheets

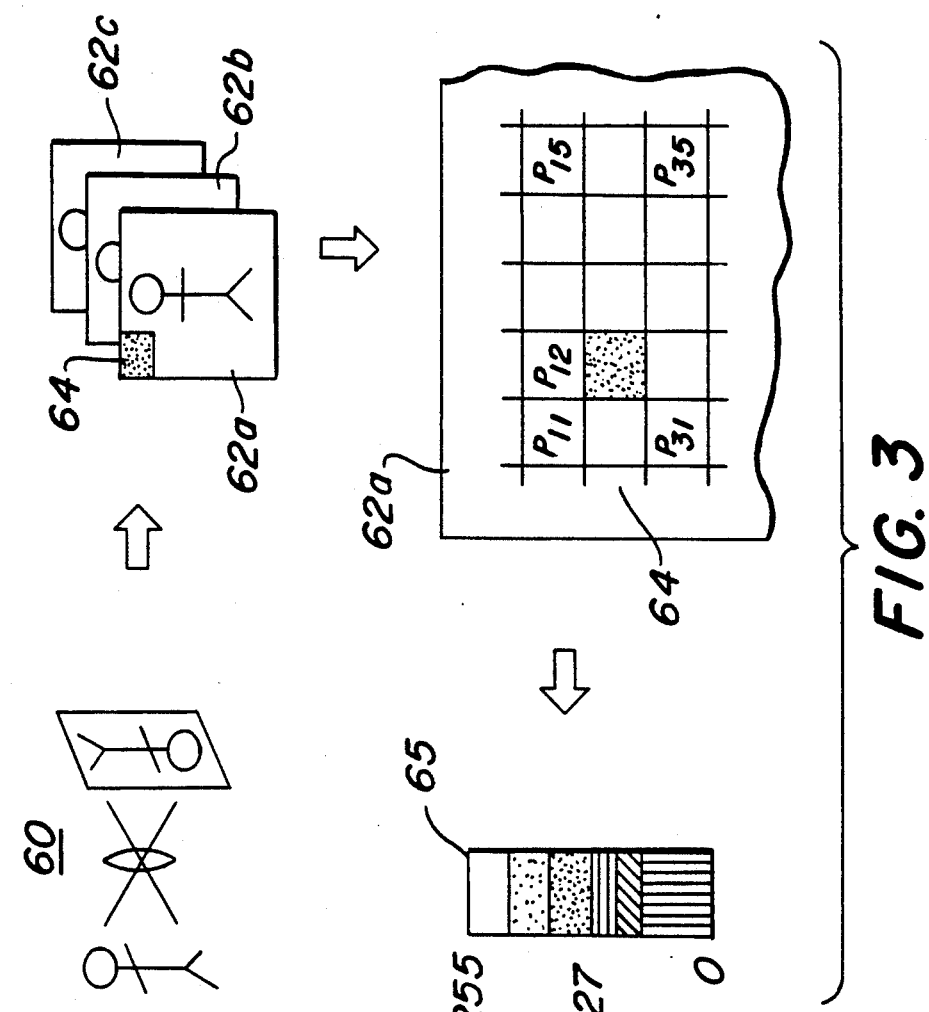
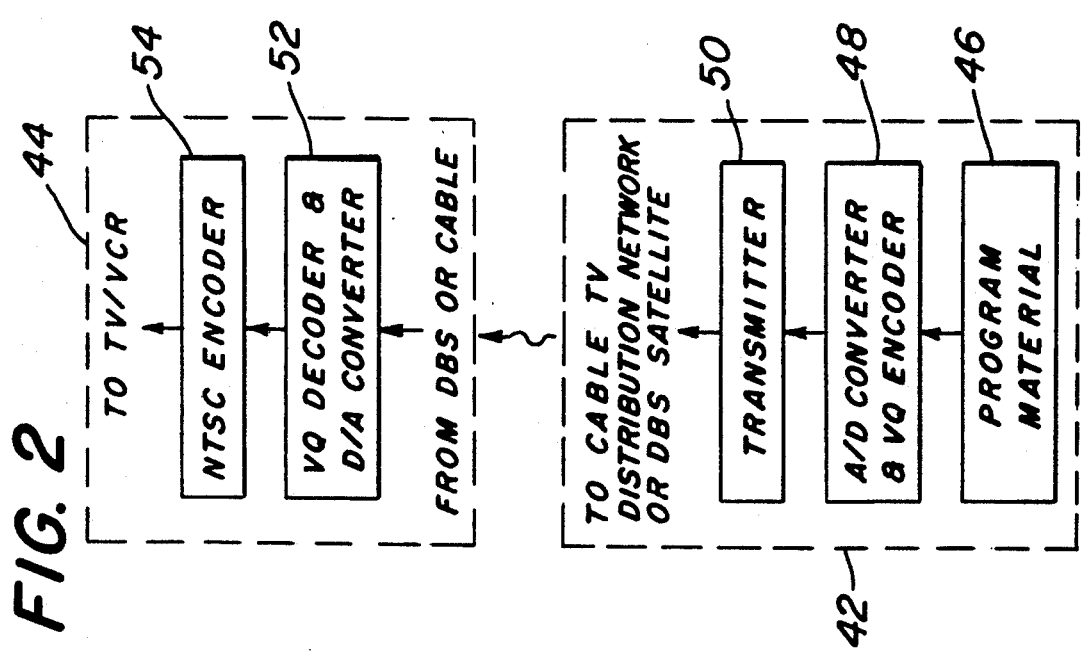

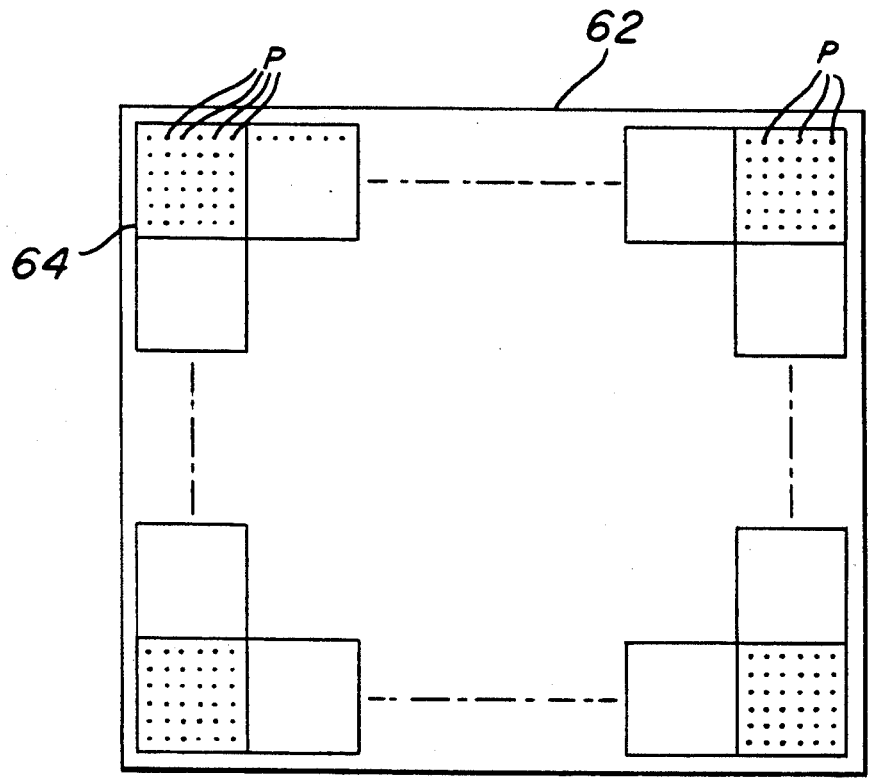

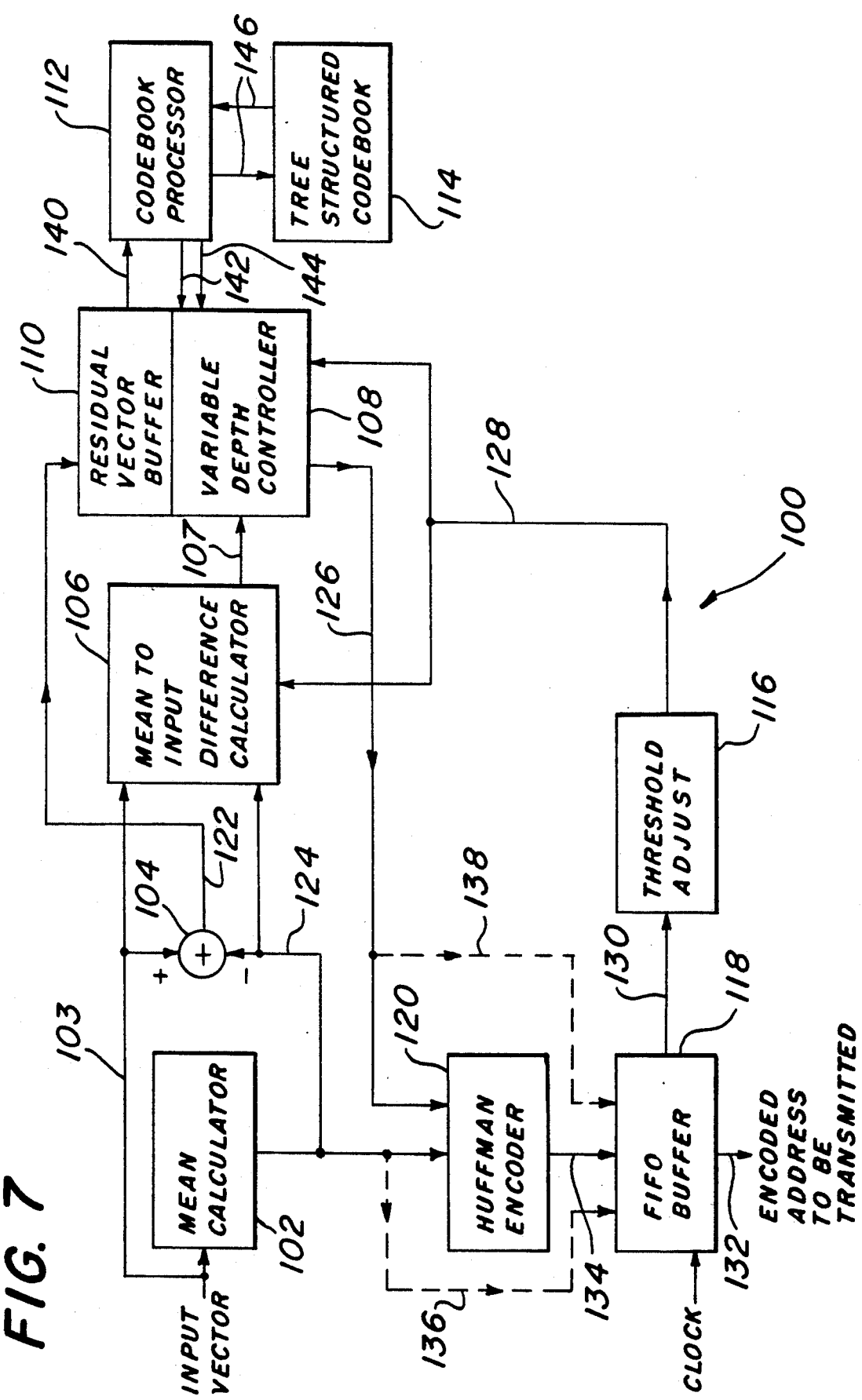

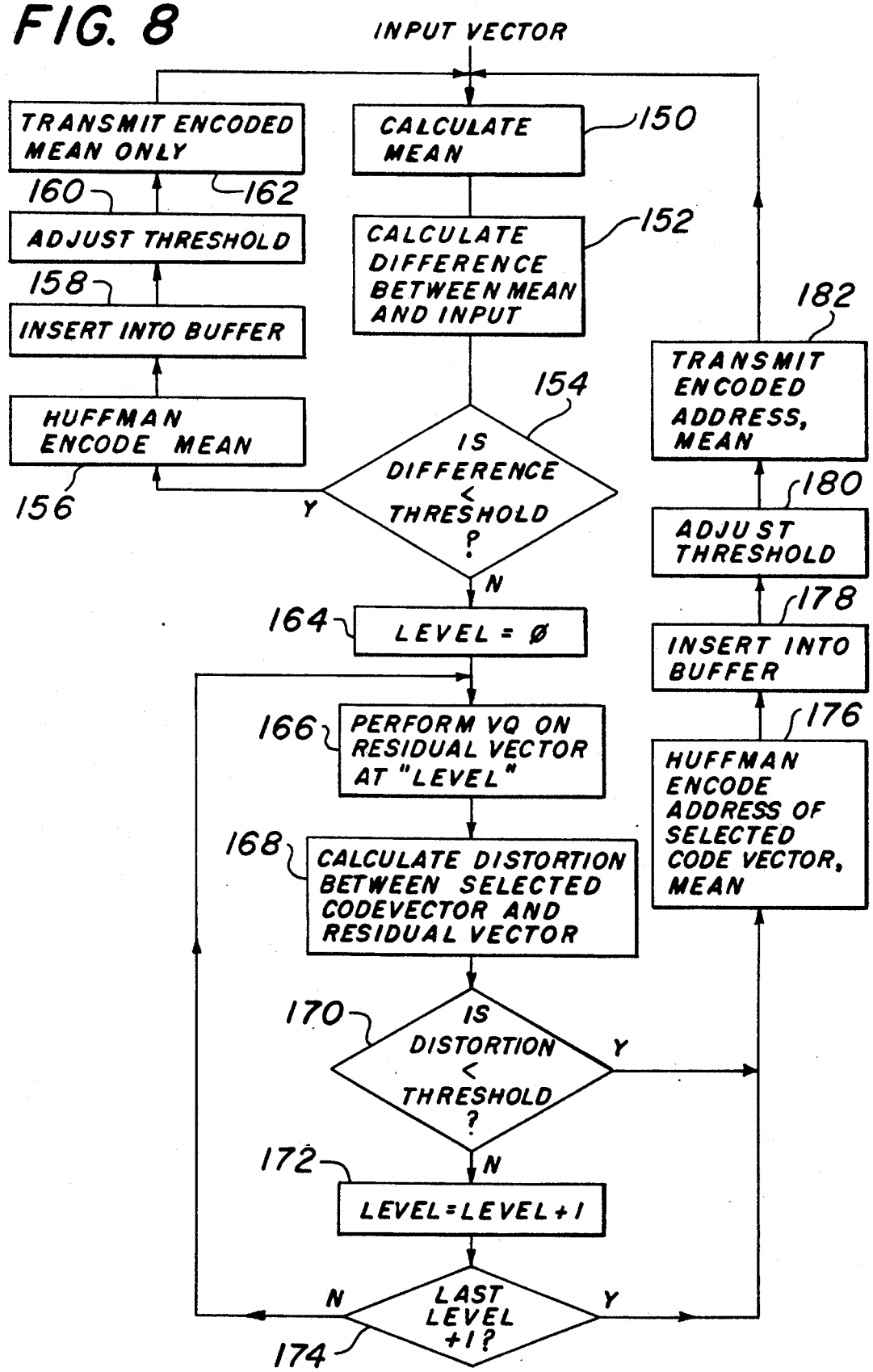

IMAGE COMPRESSION METHOD AND APPARATUS EMPLOYING DISTORTION ADAPTIVE TREE SEARCH VECTOR QUANTIZATION

RELATED APPLICATION DATA

The subject matter of this application is related to the subject matter of the following co-pending patent applications:

Ser. No. 07/794,589, entitled "Image Compression Method and Apparatus Employing Tree Search Vector Quantization With Avoidance of Transmission of Redundant Image Vector Data";

Ser. No. 07/794,491, entitled "Method and Apparatus for Transforming Between Fixed Rate Vector Quantized Data and Variable Rate Vector Quantized Data"; and, Ser. No. 07/794,493, entitled "Progressive Transmission of Vector Quantized Data".

1. Field of the Invention

The present invention relates generally to a data compression method and apparatus. More particularly, the present invention relates to a method and apparatus for compressing image data by an adaptive tree search vector quantization technique.

2. Background of the Invention

The background of the present invention is described herein in the context of pay television systems, such as cable television and direct broadcast satellite (DBS) systems, that distribute program material to subscribers, but the invention is by no means limited thereto except as expressly set forth in the accompanying claims.

Cable television operators receive much of their program material from remote earth stations via a plurality of geosynchronous orbit satellites. Typically, the cable operator selects the program material to be made available to its subscribers by making arrangements with the satellite distributors of that program material. Each cable operator then distributes the selected program material to its subscribers, via a coaxial cable distribution system, from its "cable head-end" where the material is received from the satellite. Frequently, cable operators also provide their own local programming at the site of the head-end, and further include network broadcasts as well. In DBS applications, each subscriber is capable of receiving a satellite down-link directly.

Typically, in both types of systems (cable and DBS), the program material (comprising both video and audio) is transmitted as analog signals. Conventional transmission techniques place substantial limitations on the maximum number of viewer channels that can be transmitted over any given transponder on a satellite since each channel requires a minimum bandwidth to avoid noticeable degradation and the total number of channels that can be transmitted over a given satellite transponder is limited by the bandwidth of each signal, and of the transponders. Also, the electrical properties of coaxial cable limit its bandwidth and therefore place substantial limitations on the number of channels that can be delivered to cable television subscribers using conventional transmission techniques.

There is an interest in the television industry to increase the number of channels that can be delivered to signal recipients, such as pay television subscribers. However, to achieve this goal using conventional techniques would require more satellites and/or more transponders. There is also an interest in distributing HDTV (high definition television) signals to subscribers, but again, to achieve this goal using conventional techniques would require that some other programming be eliminated, or that additional satellites be placed in orbit or that more transponders be employed, since transmission of HDTV signals requires very high bandwidth. However, due to the limited number of locations in the geosynchronous orbit belt, placing more satellites in orbit is impractical, not to mention expense. Additionally, there is a finite number of transponders that can be placed on each satellite, and transponder space is at a premium, and rental is expensive. Insofar as cable transmission is concerned, conventional techniques allow expansion of the number of channels that can be transmitted, but only by expensive upgrading or rebuilding of the cable system.

Digital image transmission techniques have been investigated for overcoming this problem. Digital image transmission offers the advantage that digital data can be processed at both the transmission and reception ends to improve picture quality. However, the process of converting the program material from analog form to digital form results in data expansion. Thus, if the digitized program material were to be transmitted in raw digital form, the number of channels that could be transmitted over the satellite, or over the cable, would decrease, rather than increase.

Data compression techniques may be employed to maximize the amount of digital information that can be transmitted. Lossless compression techniques, such as Huffman encoding and LZW (Lempel, Ziv and Welch) encoding, offer, at best, compression ratios of 2.5 to 1 and do not sufficiently compensate for the amount of data expansion that occurs in converting data from analog to digital form.

A number of so-called "lossy" compression techniques have been investigated for digital image compression. DCT (discrete cosine transform) is one known method. Another method, which, until recently, has been used principally for speech compression, is vector quantization. Vector quantization has shown promise for offering high compression ratios, and high fidelity image reproduction. It has been demonstrated that, using vector quantization (hereinafter sometimes referred to as "VQ"), compression rates as high as 25:1, and even as high as 50:1, can be realized without significant visually perceptible degradation in image reproduction.

Compression of video images by vector quantization involves dividing the pixels of each image frame into smaller blocks of pixels, or sub-images, and defining a "vector" from relevant data (such as intensity and/or color) reported by each pixel in the sub-image. The vector (sometimes called an "image vector") is really nothing more than a matrix of values (intensity and/or color) reported by each pixel in the sub-image. For example, a black and white image of a house might be defined by a 600×600 pixel image, and a 6×6 square patch of pixels, representing, for example, a shadow, or part of a roof line against a light background, might form the sub-image from which the vector is constructed. The vector itself might be defined by a plurality of gray scale values representing the intensity reported by each pixel. While a black and white image serves as an example here, vectors might also be formed from red, green, or blue levels from a color image, or from the Y, I and Q components of a color image, or from transform coefficients of an image signal.

Numerous methods exist for manipulating the block, or sub-image, to form a vector. R. M. Gray, "Vector Quantization", *IEEE ASSP Mag.*, pp. 4–29 (April, 1984), describes formation of vectors for monochrome images. E. B. Hilbert, "Cluster Compression Algorithm: A Joint Clustering/Data Compression Concept", Jet Propulsion Laboratory, Pasadena, Calif., Publ. 77-43, describes formation of vectors from the color components of pixels. A. Gersho and B. Ramamurthi, "Image Coding Using Vector Quantization", *Proc. IEEE Int. Conf. Acoust., Speech,. Signal Processing*, pp. 428–431 (May, 1982), describes vector formation from the intensity values of spatially contiguous groups of pixels. All of the foregoing references are incorporated herein by reference.

By way of example, a television camera might generate an analog video signal in a raster scan format having 600 scan lines per frame. An analog to digital converter could then digitize the video signal at a sampling rate of 600 samples per scan line. Digital signal processing equipment could then store the digital samples, and group them into vectors.

Before quantizing an image, a vector quantizer stores a set of "codevectors" in a memory called a codebook. Codevectors are vectors which are chosen to be representative of commonly found image vectors. For example, one codevector might be a 6×6 pixel solid black patch. Another codevector might have all white pixels in the top three rows, and all black pixels in the bottom three rows. Yet another codevector might have a gradient made up of white pixels in the top row, black pixels in the bottom row, and four rows of pixels in between having shades of gray from light to dark. The quantizer stores a sufficient variety of codevectors in the codebook so that at least one closely matches each of the many image vectors that might be found in the full image. Typically, a codebook of representative codevectors is generated using an iterative clustering algorithm, such as described in S. P. Lloyd, "Least Squares Optimization in PCM", *Bell Lab. Tech. Note*, (1957) (also found in IEEE Trans. Inform. Theory, Vol. IT-28, pp. 129-137, March, (1982); and, J. T. Tou and R. C. Gonzalez, "Pattern Recognition Principles", pp. 94-109, Addison-Wesley, Reading, Mass. (1974). Both of these references are incorporated herein by reference.

Each codevector is assigned a unique identification code, sometimes called a label. In practice, the identification codes, or labels, are the memory addresses where the closest codevector to the image vector is found. (In the appended claims, the term "ID code" is sometimes employed to refer to these labels or addresses,) Compression is achieved by replacing the codevector in the codebook which most closely matches the image vector by the label, or memory address.

By way of example, the codevector having the solid black patch described above, might be assigned address #1. The codevector having the white pixels in the top half and black pixels in the bottom half might be assigned address #2, and so on for hundreds or thousands of codevectors. When quantizing a full image, a vector quantizer divides the full image frame into a series of image vectors. For each image vector, the vector quantizer identifies one closely matching codevector. The vector quantizer then generates a new signal made up of the series of labels, or memory addresses where the codevectors were found. For the example of a full image of a house, the vector quantizer would divide the full image into numerous image vectors. The quantizer might then replace image vectors from shadowed areas with address #1 (the solid black patch), and it might replace the roof line image vectors with address #2 (white in the top half and black in the bottom half). Compression results because, typically, the length of the labels or addresses is much smaller than the size of the codevectors stored in memory. Typically, the addresses are transmitted by any conventional technique so that the image can be reconstructed at the receiver.

Reconstruction of the original full image at the receiver (or at least a very close approximation of the original image) may be accomplished by a device which has a codebook, identical to the codebook at the transmitter end, stored in a memory. Usually, the device that performs vector quantization and compression at the transmitter is called an encoder, and the device that performs decompression and image reproduction at the receiving end is called a decoder. The decoder reconstructs (at least an approximation of) the original image by retrieving from the codebook in the decoder the codevectors stored at each received address. Generally, the reconstructed image differs somewhat from the original image because codevectors do not usually precisely match the image vectors. The difference is called "distortion." Increasing the size of the codebook generally decreases the distortion.

Many different techniques for searching a codebook to find the codevector that best matches the image vector have been proposed, but generally the methods can be classified as either a full search technique, or a branching (or tree) search technique. In a full search technique, the vector quantizer sequentially compares an input image vector to each and every codevector in the codebook. The vector quantizer computes a measure of distortion for each codevector and selects the one having the smallest distortion. The full search technique ensures selection of the best match, but involves the maximum number of computational steps. Thus, while distortion can be minimized using a full search technique, it is computationally expensive. Y. Linde, A. Buzo and R. Gray, "An Algorithm For Vector Quantizer Design", *IEEE Transactions on Communications.* Vol. COM-28, No. 1 (January, 1980), incorporated herein by reference, describes the full search technique and the computational steps involved in such a search. The full search technique is sometimes called "full search vector quantization" or "full search VQ".

The tree search technique reduces the number of codevectors that must be evaluated (and thus reduces search time), but generally does not gaurantee that the minimum distortion vector will be selected. A tree search technique can be considered as one that searches a sequence of small codebooks, instead of one large codebook. The codebook structure can be depicted as a tree, and each search and decision corresponds to advancing one level or stage in the tree, starting from the root of the tree. A detailed description of the tree search technique may be found in R. M. Gray and H. Abut, "Full Search and Tree Searched Vector Quantization of Speech Waveforms," *Proc. IEEE Int. Conf. Acoust., Speech, Signal Processing*, pp. 593-96 (May, 1982), and R. M. Gray and Y. Linde, "Vector Quantization and Predictive Quantizers For Gauss Markov Sources", *IEEE Trans. Comm.*, Vol. COM-30, pp. 381-389 (February, 1982), both of which are incorporated herein by reference. The tree search technique is sometimes referred to as "tree-search vector quantization", "tree-search VQ" and "TSVQ." The tree-search technique has found favor for compressing dynamic images, since it is computationally faster. However, since tree search VQ does not gauruntee selection of the optimum vector, it requires a larger codebook to achieve the same distortion as full search VQ.

The process of vector quantizing data can be either "fixed rate" or "variable rate." Fixed rate VQ occurs when all of the transmitted address data has the same length, and a vector address is transmitted for all vectors in the image. Generally speaking, variable rate VQ offers the advantage that the average rate at which VQ data is transmitted is less than the rate that would be experienced if transmission of fixed rate VQ data were employed for the same image at the same distortion level. In the context of pay television systems, this advantage can be significant, since it can represent a much greater increase in the number of channels that can be carried over existing media (such as satellite and cable) than would be realized if fixed rate VQ were employed.

Several techniques are available for implementing variable rate VQ. In one technique, the quantity of compressed data generated by an image depends on the image content. For example, a variable rate VQ system might employ two different vector sizes. A large vector size might be used to describe simple parts of the image, and a small vector size might be used to describe complex parts of the image. The amount of compressed data generated depends on the complexity of the image. Sung Ho and A. Gersho, "Variable Rate Multi-Stage Vector Quantization For Image Coding", University of California, Santa Barbara (1988) (Available as IEEE Publ. No. CH 2561-9 88 0000-1156) teach one such technique. This reference is incorporated herein by reference. A disadvantage of this type of variable rate VQ is that the decoder is always more complex than a fixed rate decoder since the decoder requires a video buffer store to reconstruct the image, whereas a fixed rate decoder does not.

Another variable rate VQ scheme is described in E. A. Riskin, "Variable Rate Vector Quantization of Images", Ph. D. Dissertation—Stanford University, pp 51 et seq. (May, 1990), incorporated herein by reference. Riskin employs an "unbalanced" tree structured codebook. An "unbalanced" tree structure is simply an incomplete tree; in other words, some branches of the tree may extend to further levels of the tree than other branches. As is common in tree search VQ, Riskin's codebook is searched by advancing from level to level along selected branches. Encoding will occur at different levels of the tree (in part due to the unbalanced structure of the tree), thereby achieving variable rate VQ, since the address length is a direct function of the level from which a codevector is selected. One disadvantage of this system is that encoding is not adaptive in any sense, and therefore the Riskin system does not perform variable rate VQ in a most optimal fashion.

It is therefore desirable to provide a method for implementing variable rate VQ transmission in which the decoder is not significantly more complex than a fixed rate decoder. It is also desirable that the method be distortion adaptive and not suffer from the shortcomings of Riskin type systems. The present invention achieves these goals.

SUMMARY OF THE INVENTION

A variable rate vector quantization data compression method according to the present invention comprises the step of first receiving data indicative of an image to be compressed, and organizing the image data into blocks. Each block of image data defines a multi-dimensional input vector. A mean value of the input vector is determined, then the mean value is removed from the input vector to obtain a residual vector. A compression code is assigned to the mean value according to a lossless compression technique, and the compression code for the mean value is stored in a first-in, first-out (FIFO) buffer.

There is provided, in a memory of the data compressor (encoder), a tree search vector quantization codebook having plural levels of codevectors. Each codevector is representative of a possible residual vector, and each successive level of codevectors represents the possible residual vectors in greater detail than a preceding level of codevectors. A memory address is associated with each codevector, and the addresses increase in length with each successive level of codevectors. A compression code is assigned to each possible address. Each compression code has a length that is substantially inversely proportional to a predetermined likelihood that an associated codevector will be selected.

A measure of difference between the input vector and the mean value is obtained. The measure of difference is compared to a threshold value, and the following steps are performed only if the measure of difference exceeds the threshold value:

(1) an initial level of the codebook is selected;

(2) the residual vector is compared to the codevectors at the selected level and the codevector that most closely resembles the residual vector is selected;

(3) a distortion measure between the selected codevector and the residual vector is obtained, and the distortion measure is compared to the threshold value;

(4) the next level of the codebook is selected if the distortion value exceeds the threshold value; and, (5) steps 1 through 4 are repeated until either the distortion value does not exceed the threshold value or a last level of the codebook has been reached. Either way, a finally selected codeword is obtained, and the compression code of its corresponding address is stored in the FIFO buffer.

The process described in the preceding paragraphs is repeated for each new input vector while the bits of the compression codes are sequentially transmitted out of the FIFO buffer to receiving locations (decoders) at a fixed data rate. Simultaneously, a measure of unused FIFO buffer capacity is maintained. The threshold value is periodically adjusted based upon the measure of unused FIFO capacity by automatically increasing the threshold value when the measure of unused FIFO capacity indicates that unused capacity is decreasing, and by automatically decreasing the threshold value when the measure of unused FIFO buffer capacity indicates that unused FIFO capacity is increasing. Adjustment of the threshold value ensures that the buffer does not empty or overflow as a result of storing variable length compression codes but transmitting the same at a fixed data rate.

In another embodiment of the invention, the threshold value may be calculated in the encoder (or found by trial and error) such that the amount of compressed data generated by a predetermined number of images is constant. For example, the threshold value can be set for each image so that it generates a fixed quantity of compressed data.

According to a preferred embodiment of the invention, the compression codes are Huffman codes.

According to the invention, there may be provided at each receiving location a decoder apparatus that contains a Huffman decoder for retrieving the transmitted mean value and codevector address from the received data. The decoder contains a tree search vector quantization codebook that is substantially identical to the codebook at the encoder. The decoder employs each received address to retrieve from its codebook the codevector residing at the received address to reproduce a substantial representation of the residual vector. The received mean value is added to the reproduced representation of the residual vector to reproduce a substantial representation of the input vector. At the decoder, the reproduced representations of the input vectors are employed to create a substantial representation of each image frame so that the image may be displayed and/or recorded by a user employing the decoder. An advantage of this technique is that, aside from the Huffman decoder, the VQ decoder has substantially the same complexity as a fixed rate decoder.

Other features of the invention will become evident from the following drawings and specification.

BRIEF DESCRIPTION OF THE DRAWINGS

FIG. 2 is a block diagram illustrating another application of the invention to a pay television system employing cable or direct broadcast satellite for transmitting program material.

FIG. 3 graphically illustrates the concept of constructing input (image) vectors from pixels of image frames.

FIG. 4 graphically illustrates an image frame as defined by a plurality of pixels.

FIG. 6 illustrates an exemplary memory for storing a codebook.

FIG. 7 is a block diagram of one embodiment of an encoder apparatus for carrying out the vector quantization compression method of the present invention.

FIG. 8 is a flowchart illustrating both the operation of the apparatus of FIG. 7 and one preferred embodiment for carrying out the vector quantization compression method of the present invention.

DETAILED DESCRIPTION OF THE DRAWINGS

Before proceeding to the description of the drawings, it should be understood that, although the invention is described herein in the context of broadcasting television signals, such as movies and the like, in a pay television system, the present invention is in no way limited thereto. Rather, the present invention may be employed wherever it is desired to compress and transmit any type of data, including conventional (i.e., free) television broadcasts, image data, voice data, etc.

Figure 1:
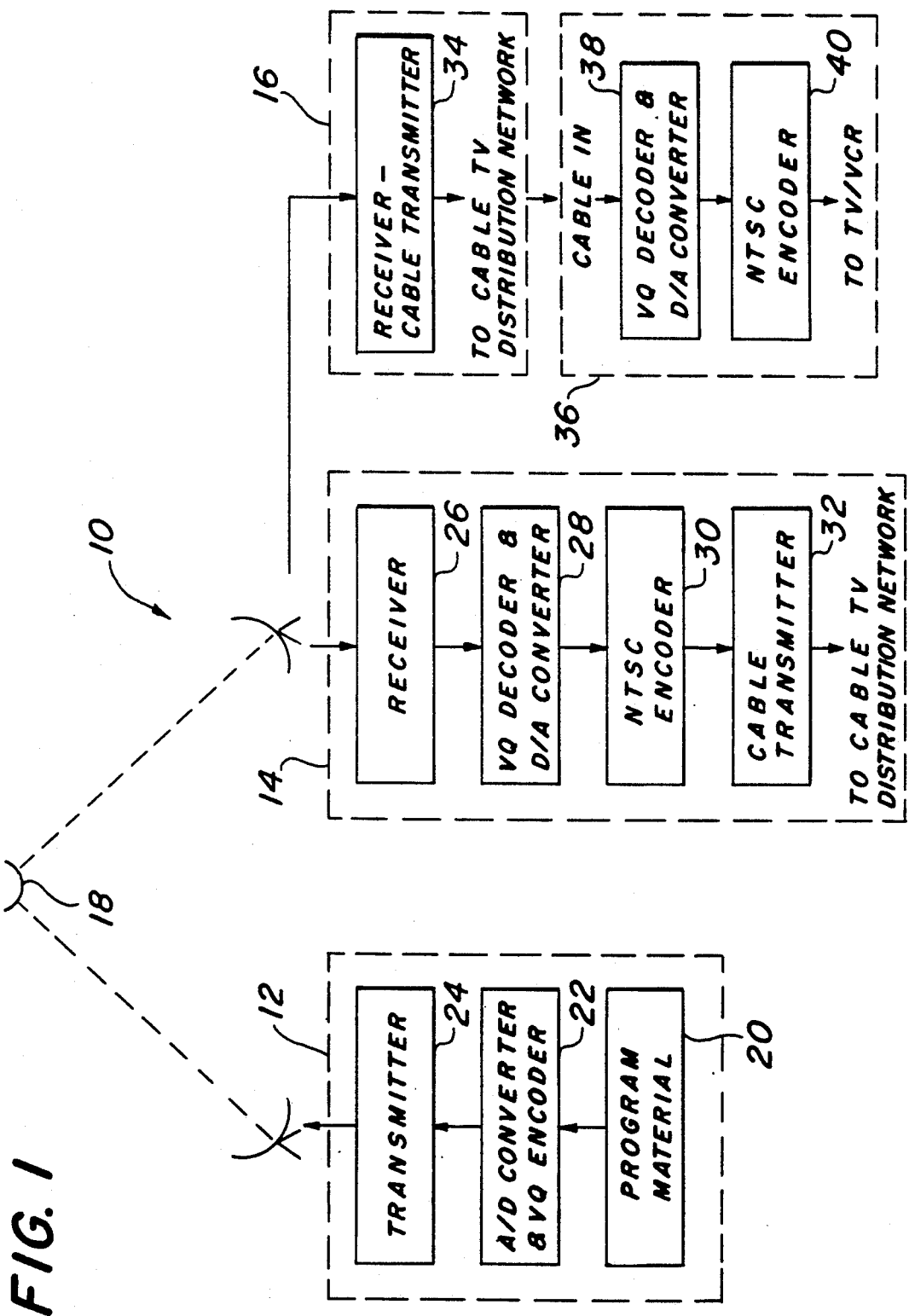
FIG. 1 is a block diagram illustrating an application of the present invention to a pay television system employing satellite communication to transmit program material.

Referring now to the drawings, wherein like numerals indicate like elements, there is illustrated in FIG. 1 an exemplary application of a vector quantization image compression system according to the present invention wherein moving image data (e.g., television signals, such as movies, etc.) is communicated from a point of origin 12 to receiving locations such as 14 or 16. Typically, the point of origin 12 might include a source 20 of program material that supplies movies, and the like in analog form to an apparatus (encoder) 22 for digitization and data compression by vector quantization. Details of apparatus 22 will be supplied hereinafter. Compressed, digitized data is transmitted to a satellite 18, via transmitter 24, for reception by a plurality of earth stations such as 14 or 16. The earth stations 14, 16 may be the head-end of a cable television distribution system of the type which receives signals from the satellite 18 and distributes them to a plurality of subscribers via coaxial cable. Alternatively, as will be explained in connection with FIG. 2, one or more of the earth stations may be DBS (direct broadcast satellite) subscribers who receive signals directly from the satellite 18. The term "pay television" and "pay television subscriber" is used in the instant specification and accompanying claims to encompass both cable television and direct broadcast satellite applications. However, as mentioned above, the invention is by no means limited to pay television systems, but has application to conventional (i.e., free) television transmission and reception.

Returning now to the cable television application of FIG. 1, there is shown two types of cable head end installations 14, 16 that may receive the down-link from the satellite 18. The cable head-end installation 14 may employ the received data in a different manner than the cable head end installation 16, however, the end result (availability of image data for display or recording) is the same to the cable television subscribers of each system. The two examples of cable head-end installations 14, 16 are shown to demonstrate the versatility of the present invention.

The cable head-end installation 14 may receive the data transmitted by the station 12 via receiver 26, then employ an on-site apparatus (decoder) 28 for decompressing the received data and converting the same back to analog form. Another on-site apparatus 30 may convert the analog data to conventional NTSC signals for transmission over the cable to subscribers in conventional form. Thus, in the case of cable head-end installation 14, the cable head-end operator distributes analog NTSC cable television signals to subscribers in conventional form.

In the case of the cable head-end installation 16, the data transmitted by station 12 may be received via a receiver/transmitter 34 that conditions the received data for transmission over the cable system to cable television subscribers. That is, the operator of the cable head end system 16 does not decode or decompress the received data, nor does it convert the same to analog form. Rather, the operator of the cable head-end system 16 simply transmits the compressed image data over cable television system for receipt by the subscribers.

Subscribers of the system 16 must therefore be provided with VQ decoder boxes 36 (described in detail hereinafter), whereas subscribers to the system 14 may employ conventional set-top decoders. The VQ decoder boxes 36, in general, comprise a VQ decoder 38 for decompressing received data and converting the same to analog form and an apparatus 40 for converting the analog data to NTSC format for display on a TV or recording on a VCR. The decoder box 36 may be embodied as a set-top decoder, or may be built into a television set or VCR.

While subscribers to the system 16 must use the above-described decoder box 36, an advantage of the system 16 is that, due to the highly compressed nature of the image data sent over the cable distribution network by the cable operator, many more channels may be transmitted over the cable to subscribers as may be transmitted over the cable in the system 14. Alternatively, the system 16 enables transmission of HDTV signals without sacrificing other channel space.

FIG. 2 illustrates another application of the present invention, also to a pay television system. In the system of FIG. 2, block 42 represents a cable or DBS head-end. The operator of the head end 42 may insert program material 46 (such as network television stations, video tapes, etc.) directly at the locale of the head-end for transmission (via either cable or DBS) to the subscribers. Thus, as shown in FIG. 2, the head-end 42 may include an apparatus (encoder) 48 for digitizing and compressing the locally provided program material 46, and a transmitter 50 for transmitting data from encoder 48 (again, via either cable or satellite) to each of the subscribers. The encoder 48 may be of the same type as encoder 22.

Each subscriber to the system of FIG. 2 is equipped with a decoder box 44 (that may be identical to the decoder box 36 of FIG. 1) that comprises apparatus (decoder) 52 for decompressing received data and converting the same to analog form. The decoder 44 may also be provided with apparatus 54 for placing the analog data into NTSC format for display on a television set or for recording via a VCR. As in the case of decoder box 36, the decoder 44 may be embodied as either a set-top decoder box, or may be built into a television set or VCR.

FIG. 3 illustrates the concept of converting moving or dynamic images 60, such as program material 20 or 46, into input image vectors for vector quantization. The concept illustrated in FIG. 3 is well known. See, for example, R. L. Baker, "Vector Quantization of Digital Images", Ph.D. Dissertation, Stanford University, Department of Electrical Engineering (1984); Gray, R. M., "Vector Quantization", *IEEE ASSP Mag.*, Vol. 1, pp. 4,29 (April, 1984); Goldberg, M., Boucher, P. R. and Shlien, S., "Image Compression Using Adaptive Vector Quantization", *IEEE Comm.*, Vol. COM-34 No. 2 (February, 1986); and, Nasrabadi, N. M. and King, R. A., "Image Coding Using Vector Quantization; A Review", *IEEE Comm.*, Vol. 36, No. 8 (August, 1988). As shown in FIG. 3, and as is common in the art, each of the temporally spaced image frames 62a, 62b, 62c, etc. representing the moving image 60 is defined by a plurality of pixels P. In the case of a black and white image, each pixel P reports an intensity value, whereas in the case of a color image, each pixel may report luminance and chrominance values, or other values indicative of a color associated with the pixel.

As mentioned in the background section above, in vector quantization of an image, e.g., image frame 62a, the pixels P of each image frame are grouped into blocks that define sub-images of each image frame. Each of these blocks, which is a matrix of pixels, defines an input image vector. Thus, in FIG. 3, a sub-image 64 of image frame 62a is represented by the block of pixels $P_{11}, P_{12}, \ldots P_{35}$. This matrix of pixels defines one input image vector for image frame 62a. Image frame 62a, as well as each succeeding image frame 62b, 62c, etc., will usually be represented by a plurality of input image vectors.

As graphically shown at 65 of FIG. 3, the intensity and/or color values reported by each pixel P are digitized (by the A/D converter shown at 22 and 48 of FIGS. 1 and 2). For example, each intensity or color value may be represented by an 8 bit digital word such that 255 intensity and/or color levels are possible for each pixel. Thus, in the case of a black and white image, only one input vector, containing the intensity values reported by each pixel in the block, is required for each block or sub-image. However, in the case of a color image, it may be desirable to provide several input image vectors for each block or sub-image, e.g., one input image vector containing intensity data and another containing color data. Another possibility is that three input image vectors are provided for each block in a color image, one containing Y data, another containing I data, and a third containing Q data. According to the vector quantization technique, each of these input image vectors is then compared to the codevectors stored in the codebook to select a best match codevector for each.

It will be appreciated from the foregoing that, in the case of image data, input vectors will usually be multi-dimensional and usually have at least two dimensions (e.g., the matrix of intensity values shown in FIG. 3). However, there may be instances where input vectors are uni-dimensional, for example, where input vectors are constructed from the intensity values of only single rows or columns of pixels. Input vectors may have more than two dimensions, for example, where input vectors are constructed from pixel blocks of temporally spaced images (known as three dimensional vector quantization), and/or where data in addition to intensity data (e.g., color) is included in each vector.

Figure 5:
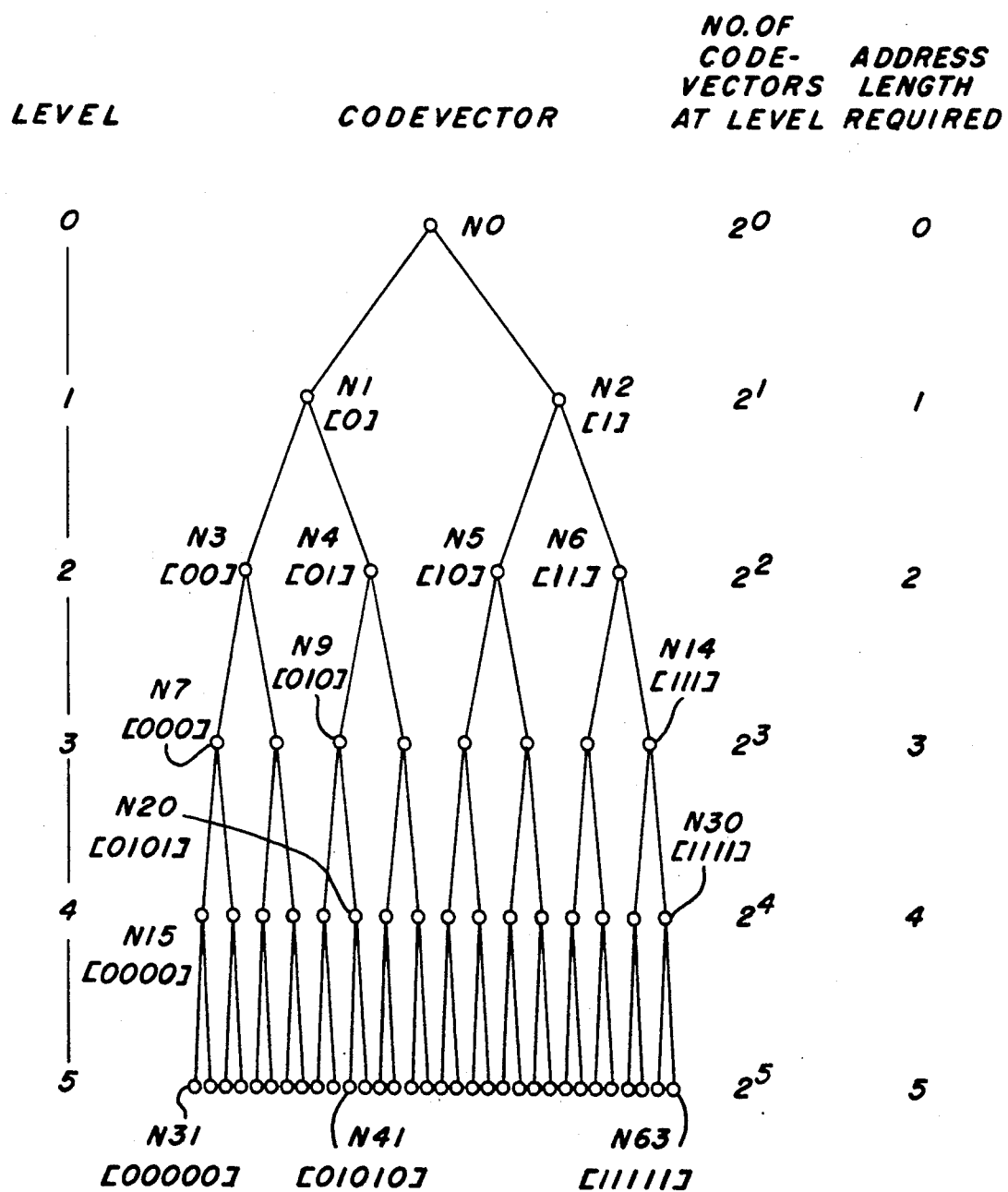
FIG. 5 illustrates the organization of an exemplary tree search VQ codebook that may be employed in connection with the practice of the present invention.

According to the present invention, a tree structured codebook is employed. FIG. 5 graphically illustrates the structure of an exemplary tree search VQ codebook that may be employed. The construction and use of tree search codebooks to perform vector quantization is well known in the art. See, for example, the aforementioned article by R. M. Gray entitled "Vector Quantization", and the aforementioned Ph.D. dissertation of R. L. Baker entitled "Vector Quantization of Digital Images". See also the aforementioned Ph.D. dissertation of E. A. Riskin entitled "Variable Rate Quantization of Images", and, U.S. Pat. No. 4,878,230 of Murakami et al. entitled, "Amplitude Adaptive Vector Quantization System." The aforementioned article by Linde, Buzo and Gray entitled "An Algorithm for Vector Quantizer Design" describes one preferred method for constructing codebooks that may be employed in the practice of the present invention.

The exemplary tree search VQ codebook of FIG. 5 comprises a plurality of levels 0–5 of codevectors wherein level 0 is defined by a root node N0 of the tree and subsequent levels are defined by additional nodes N1–N62 that are reached as branches of the tree are traversed. Each node is actually a codevector, so the exemplary codebook of FIG. 5 has 63 codevectors N0–N62. As shown in FIG. 6, the codevectors (CV) are stored in a memory M and each codevector CV has an associated address which serves as the ID code, or label, discussed in the background section above. As also mentioned in the background section, compression results because the address length is typically much shorter than the length or size of each codevector.

As is known to those skilled in the art, in a typical tree search VQ codebook, the codevectors at each successive level of the tree usually represent possible input vectors with greater accuracy than codevectors at a preceding level. Thus, the codevectors at level 5 of the exemplary tree of FIG. 5 may represent possible input vectors with greater accuracy than the codevectors at level 4, and the codevectors at level 4 may represent possible input vectors with greater accuracy than the codevectors stored at level 3, and so on. Such a tree search vector quantization codebook structure is well known in the art. Additionally, codevectors higher up in the tree (e.g., level 0 and 1) do not require as long of an address to access as do codevectors lower in the tree (e.g., levels 4 and 5), since there are fewer choices in the upper levels than in the lower levels, and a longer address length is needed to specify lower levels of the tree in any event. Thus, in the exemplary codebook of FIG. 5, an address length of 5 bits is required to address one of the $2^5$ codevectors in level 5, whereas an address length of 3 bits is required to address one of the $2^3$ codevectors in level 3, etc. Thus, the memory addresses have a variable length wherein the length of the addresses increases with each successive level of codevectors, and moreover, the address specifies not only a corresponding codevector, but also the level in the tree in which that codevector can be found. It will therefore be appreciated that, if a search technique were to be implemented wherein codevectors are selected from different levels of the tree, addresses of varying length will be provided, thus enabling variable rate VQ. The present invention employs such a technique. For purposes of the following discussion, and in the drawing, the addresses of some codevectors are indicated in brackets ("[]").

Considering the structure of a tree search codebook in greater detail and referring to the tree search codebook of FIG. 5 as an example, it can be seen that successive levels of the tree search codebook are formed by branches emanating from each node in a preceding level. Thus for example, from the root node N0, the first level of the tree search codebook of FIG. 5 is formed by the branches to N1 and N2; the second level is formed by the branches from N1 to N3 and N4 and the branches from N2 to N5 and N6. As shown in the FIG., two branches emanate from each node at a given level until the bottom level of the tree is reached. It is understood by those skilled in the art that while the tree search codebook of FIG. 5 has two branches emanating from each node, other tree search codebooks may be used in accordance with the present invention that have more branches emanating from each node.

The address length of each codevector depends upon the number of branches emanating from each node as well as the level of the tree at which the codevector resides. In typical applications, VQ codebooks are stored in a digital electronic memory wherein the addresses are binary. In general, then, the length of the binary address of a codevector at a given level (L) can be expressed as:

Address Length = $L(\log_2 b)$ bits, where b = the number of branches emanating from each node. Thus, for example, in the tree search codebook of FIG. 5, where there are two branches emanating from each node, the codevectors of the first level of the codebook (residing at N1 and N2) require an address length of only 1 bit. The codevectors at each successive level of the tree search codebook of FIG. 5 require 1 additional address bit. The 5th level of the codebook, therefore, requires 5 address bits. Applying the formula above to a tree search codebook having four branches emanating from each node, each successive level of codevectors requires two additional address bits. Similarly, in a codebook having eight branches emanating from each node, each successive level of codevectors requires three additional address bits, and so on.

With binary addressing, the address of a codevector (node) at a given level of the tree comprises the address of the parent node in the preceding level plus the number of bits necessary to distinguish that codevector from the other codevectors (nodes) having the same parent node. As described above the number of additional bits depends on the number of branches emanating from the parent node and can be expressed as:

$\log_2 b$ bits, where b = the number of branches emanating from the parent node. Thus, for example, referring to the tree search codebook of FIG. 5 wherein two branches emanate from each node, the address of the codevector at N4 is [01] which comprises the address of the codevector at parent node N1 ([0]) plus an additional bit ([1]) to distinguish the codevector at N4 from the codevector at N3 which also has node N1 as a parent. Similarly, for example, the address of the codevector at N9 is [010] which comprises the address of the codevector at parent node N4 ([01]) plus an additional bit ([0]) to distinguish the codevector at N9 from the codevector at N10 which also has node N4 as a parent.

A result of the structure described above is that from the address of a codevector at a node in a lower level of the tree, the addresses of the codevectors at the parent nodes in preceding levels can be obtained by simply truncating the lower level address by $\log_2 b$ for each preceding level. Thus, for example, knowing the address of the codevector at N41 [01010] in the 5th level of the tree search codebook of FIG. 5, the address of the codevector at parent node N20 in the preceding 4th level is obtained simply by truncating the address of the codevector at N41 by 1 bit. Thus, the address of the codevector at parent node N20 is [0101] (i.e. [01010] with the last bit removed). Similarly, the address of the codevector at the parent node N4 in the 2nd level of the tree can be obtained by truncating 3 bits (5-2) from the bottom level address. Thus, the address of the codevector at N4 is [01] (i.e. [01010] with the last three bits removed).

The number of codevectors in a tree search codebook can be expressed mathematically as:

$\sum b^L$, for L = 1 to N

'where N = total number of levels in the codebook;
L = the Lth level of the codebook; and B=the number of branches emanating from each node of the codebook.

Thus, consider for example a tree search codebook having 10 levels and wherein 4 branches emanate from each node. Applying the formula above, the codebook would contain approximately 1.33 million codevectors. Suppose further, for example, that each codevector is constructed from a 3×4 matrix of pixels wherein each pixel represents an intensity value between 0 and 255. Each pixel would require 8 bits or 1 byte of memory storage, and therefore, each codevector would require 12 bytes of memory storage (3×4 pixels). Consequently, the codebook would require 16 Mbytes of storage.

In the prior art, vector quantization is commonly (but not always) carried out by searching each input vector all the way through to the bottom of the tree to find the codevector at the bottom of the tree that most closely resembles the input vector. According to the present invention, and as will be explained in detail below, the maximum level of the tree to which a search is carried out varies according to a variable threshold. More particularly, the level of the tree to which each search is carried out is governed by a measure of distortion between each input vector and the best match codevector at a particular level, and comparing the distortion measure to the threshold. (Actually, in the preferred embodiment, a residual vector, calculated from the input vector, is used to search the codebook, but the present invention is not limited thereto except as expressly set forth in the accompanying claims.) If the distortion measure is less than the threshold, the codevector at that particular level is selected. However, if the distortion measure is greater than the threshold, then the best match codevector at the next level of the tree is selected, and the process is repeated until the distortion measure is less than the threshold, or until the last level of tree has been reached. Further, the threshold varies according to a "fullness measure" of a buffer that stores VQ data to be transmitted, which, in effect, causes the threshold to vary as a function the average length of VQ data stored in the buffer. Alternatively, a threshold value may be derived and fixed for a predetermined number of images which causes those particular images to generate a fixed amount of compressed data. FIG. 7, which illustrates a VQ encoder apparatus for carrying out this method, and FIGS. 8-10 which illustrate the method in greater detail, will now be explained.

Referring first to FIG. 7, there is illustrated a VQ encoder apparatus 100 for carrying out the method of the present invention. An input vector (e.g., the digitized matrix 64 of pixel values taken from a portion of the image frame 62a) is received and supplied to a circuit 102 which computes the mean value of the input vector. The mean value is supplied on a line 124 to the "−" input of an adder circuit 104 which also receives on a "+" input, via line 103, the input vector itself. The mean value is also supplied to a Huffman encoder circuit 120 for purposes to be described hereinafter. The adder circuit 104 subtracts the mean value from the input vector to supply, on a line 122, a so-called "residual vector", which is the input vector with its mean value removed. As will become evident hereinafter, it is the residual vector that is used for searching the codebook to select a best match codevector. This style of vector quantization, known as mean removed vector quantization (MRVQ), is well known in the art and has numerous advantages. See, for example, the aforementioned article by R. M. Gray entitled "Vector Quantization" and the aforementioned Ph.D. dissertation by R. L. Baker entitled "Vector Quantization of Digital Images". Although the invention is described herein as employing MRVQ, this is simply the preferred embodiment, and the invention is not limited to use of MRVQ, except as may be expressly set forth in the accompanying claims. Rather, if desired, the input vector itself, or some other variant thereof, may be used to carry out the codebook search to select the best match codevector (in the claims, the term "processed input vector" has been employed to cover all such possibilities).

As shown, the mean value is also provided on line 124 to one input of a mean value to input vector distortion calculator 106, and the input vector is also provided on line 103 to another input of calculator 106. The function of the calculator 106 is to calculate a measure of difference between the mean value and input vector. This may be performed by converting the mean value to a vector, then computing a measure of difference between the mean vector and input vector by any well known technique, such as by computing the absolute difference of the vectors, or by computing the square root of the difference between the squares of the two vectors. Also supplied as an input to the calculator 106, on line 128, is a threshold value whose magnitude is determined as hereinafter described. The calculator 106 determines whether the difference between the mean value and the input vector is less than or greater than the threshold value. The result of this decision is reported, via line 107, to a variable depth controller 108. The controller 108, which functions in accordance with the flowchart of FIG. 8, is responsible for carrying out vector quantization of each residual vector. As will become evident hereinafter, if the difference between the mean value and the input vector is less than the threshold, the variable depth controller 108 does not carry out vector quantization for this particular input vector. (Alternatively, if the difference between the mean value and the input vector is less than the threshold, the input vector could still be vector quantized and the result discarded. This approach offers the advantage that the hardware implementation may be simpler.) On the other hand, if the difference exceeds the threshold, then the controller 108 carries out vector quantization by conducting a search for the codevector that best matches the residual vector.

The residual vector calculated by adder 104 is provided via line 122 to a residual vector buffer 110. Buffer 110 stores the residual vector in the event that vector quantization is indicated by the output 107 of the calculator 106. In such case, the residual vector is provided to a codebook processor 112 via line 140. A preferred circuit for the codebook processor 112 is disclosed in U.S. Pat. No. 5,031,037 entitled "Method and Apparatus for Vector Quantizer Parallel Processing." The codebook processor 112 bi-directionally communicates with a tree structured codebook 114 (of the type previously described) via a pair of lines 146. As the codebook 114 is traversed, the residual vector is compared to the codevectors at each level. The codebook processor 112 provides, on a line 142, the address of the best match codevector (e.g., per FIGS. 5 and 6), and also provides on a line 144, a measure of distortion between the current best match codevector and the current residual vector. The measure of distortion may be computed in the same manner as the measure of difference between the mean value and input vector is carried out. The manner in which this measure of distortion is employed will become evident hereinafter.

The variable depth controller 108 provides, on a line 126, the address of a finally selected codevector from the codebook 114. As shown, this address is preferably provided to the input of a Huffman encoder 120. As previously mentioned, the mean value provided by the calculator 102 is also provided to the Huffman encoder. As will be appreciated hereinafter, when the measure of difference between the mean value and input vector calculated by calculator 106 is less than the threshold, then only the mean value is supplied to the Huffman encoder 120, i.e., vector quantization for this particular input vector is not performed and therefore no address data is provided on line 126 to the Huffman encoder 120. (Alternatively, when the measure of difference between the mean value and input vector calculated by calculator 106 is less than the threshold, the input vector could still be vector quantized and the result discarded. This approach offers the advantage that the harware implementation may be simpler.) In such event, the Huffman encoder will insert a code to indicate to a receiver of VQ data that only the mean value, and no address data, has been transmitted for this particular input vector.

According to one embodiment of the invention, the best match address provided on line 142 by the codebook processor 112 for any particular node of the codebook 114 may be a variable bit length address. In the tree of FIG. 5 which has a root node and 5 subsequent levels, one additional bit is needed to address each subsequent level of the tree. If the tree is completely traversed, a 5 bit address will be generated. Alternatively, if the tree is traversed to only the third level, only a 3 bit address will be generated. (In one preferred implementation, there are sixteen branches at each level and four bits are added as each new level of the tree is traversed.) It will be understood by those skilled in the art that the tree is traversed by branching only from a selected node (codevector) at a given level to one of the subsequent nodes (codevector) reachable from the selected node. The controller 108 may convey the address of the finally selected codevector on line 126 in either a fixed rate or variable rate form. Thus, if desired, the controller 108 may place the raw address of the finally selected codevector on line 126. In such case, the length of the address will vary as the level to which searches are carried out in codebook 114 varies, i.e., the data on line 126 will be variable rate. Alternatively, the controller 108 may always convert the address to a fixed length address so as to provide fixed rate VQ data on line 126.

As mentioned, both the VQ data (addresses) from the controller 108 and the mean value from calculator 102 are provided to a Huffman encoder 120. The Huffman encoder 120, however, is not needed if variable rate data is provided on line 126 Rather, the variable rate data may be provided directly to a buffer 118 (for purposes described hereinafter) via line 138. Additionally, it is not absolutely necessary to Huffman encode the mean values provided by the mean calculator 102. Thus, if desired, mean values may also be provided directly to the input of the buffer 118 via line 136. However, use of the Huffman encoder 120 is preferred, and it is preferred that the VQ data on line 126 be provided in fixed rate from when the Huffman encoder is employed. If the Huffman encoder is not employed and the variable rate data is provided directly to the buffer, then it will also be necessary to provide a means of enabling the decoder receiving the data to separate the variable rate data words from each other. One such means is to transmit with each data word an accompanying code indicative of the length of thereof. (It will be appreciated that this code will be indicative of the level of the tree from which the final codevector was selected.) Another is to insert stop/start bits. Various other methods may be employed.

Huffman encoders are well known in the art. While many different variations of Huffman encoders are known, all operate on essentially the same principle. A Huffman encoder is a lossless data compressor that, using a lookup table, assigns separable compression codes (addresses) based on the statistical probability that a particular entry in the lookup table will be addressed. That is, the greater the probability that a particular entry in the lookup table will be addressed, the shorter the compression code. Thus, the function of the Huffman encoder 120 is to assign compression codes to each address received on line 126, wherein the compression code assigned to each address received on line 126 has a length that is inversely proportional to a predetermined probability that the codevector associated with that address will be finally selected from the codebook 114. The Huffman encoder 120 also assigns compression codes to the mean values from the calculator 102 according to the same criteria.

It will be appreciated by those skilled in the art that vectors located at higher (i.e., upper) levels of the tree (having shorter address lengths) typically occur with more frequency than those at lower levels (i.e., closer to the bottom) of the tree although this is not necessarily always the case. Whatever the wordlength of the variable rate address, the Huffman encoder assigns wordlengths substantially based on the frequency of occurence of a particular address (not on its length). Even in the case of fixed rate addresses, the Huffman encoder choses variable length codes based on frequency of occurence, and generates variable rate data.

Although a Huffman encoder has been shown for compressing the mean values and VQ (address) data, any lossless data compressor may be employed, however, a Huffman encoder is preferred.

The output of the Huffman encoder 120 is provided to the input of a first in first out (FIFO) buffer 118. If the Huffman encoder 120 is not employed, then the variable rate VQ data on line 126 may be provided directly to the input of the FIFO buffer 118 via line 138 and the mean Value data may be provided as an input via line 136. A clock serially clocks in data from the Huffman encoder 120 (or from lines 136, 138) while synchronously transmitting out data stored in the FIFO buffer on output 132. The output 132 of FIG. 7 corresponds to the output of blocks 22 and 48 of FIGS. 1 and 2.

As previously mentioned, the magnitude of the threshold determines whether the residual vector will be searched in the codebook. If a search is called for, then the magnitude of the threshold also affects the level in the codebook to which a search is conducted. This threshold is variable according to a measure of "buffer fullness", or unused capacity of the FIFO buffer 118. A measure of buffer fullness is provided on a line 130 to a threshold adjust circuit 116 which is responsive to the measure of buffer fullness to increase or decrease the magnitude of the threshold. Accordingly, when the signal on line 130 indicates that unused buffer capacity is decreasing (as a result of incoming VQ data filling the buffer faster than it is being transmitted out), the threshold adjust circuit 116 automatically increases the magnitude of the threshold value. Similarly, when the signal on line 130 indicates that unused buffer capacity is increasing (as a result of VQ data being transmitted out faster than new VQ data is filling it), the threshold adjust circuit 116 automatically decreases the magnitude of the threshold value. Co-pending, U.S. patent application Ser. No. 365,940, filed Jun. 13, 1985 entitled "Method and Apparatus for Data Compression With Reduced Distortion" discloses another application of a circuit that employs a measure of buffer fullness to adjust a value.

It will be appreciated that increasing the magnitude of the threshold value will increase the measure of difference that will be permitted between the mean value and input vector before vector quantization of the residual vector is called for. Increasing the magnitude of the threshold value will also decrease the average level to which searches are conducted through codebook 114. Decreasing the threshold value will have an opposite effect. Thus, increasing the threshold value will decrease the average length of variable rate addresses provided on line 126 (when controller 108 is programmed to provide variable rate addresses thereon), and it will decrease the average length of compression codes provided by Huffman encoder 120. Again, decreasing the threshold will have an opposite effect. It will thus be seen that, as the buffer 118 begins to approach its maximum capacity, the threshold is adjusted to effectively shorten the length of subsequent input data to the buffer 118 when variable rate data is provided on line 126, and vice versa. When the Huffman encoder is employed, threshold adjustment will affect the length of the compression codes as well. Thus, over time, the buffer will have an average capacity of preferably 50%. More importantly, however, automatic adjustment of the threshold guarantees that the buffer will not empty or overflow as a result of storing variable length data (i.e., either variable length compression codes from the Huffman encoder 120, or variable length addresses from the controller 108) while transmitting the same on line 132 at a fixed data rate.

The apparatus of FIG. 7 may be employed to implement blocks 22 and 48 of FIGS. 1 and 2.

FIG. 8 is a flowchart illustrating the operation of the circuit of FIG. 7, and particularly the operation of controller 108. As shown, upon receipt of an input vector, its mean value is calculated as shown at step 150, then the difference (distortion) between the mean and input vector is calculated, as shown at step 152. At step 154, the difference is compared to the threshold value. If the difference is less than the threshold value, then the mean value is Huffman encoded as shown at step 156, and the Huffman code is stored in the buffer 118, as shown at step 158. Then, as shown at step 160, the threshold is adjusted based upon the measure of buffer fullness. At some time, after the Huffman encoded mean value has been clocked through the buffer to the output 138, it is transmitted, as shown at step 162.

If, at step 154, it was determined that the difference between the mean value and input vector exceeded the threshold, then vector quantization is performed upon the residual vector calculated for the current input vector. Steps 164 through 174 illustrate the manner in which vector quantization is performed for the residual vector according to the present invention. The controller 108 is responsible for carrying out steps 164 through 174 of FIG. 8.

To perform vector quantization for a new residual vector, the first level of the tree structured codebook 114 is selected, as shown at step 164. Next, vector quantization is performed on the residual vector at this level to find the codevector at this level that most closely resembles the residual vector. At step 168, a measure of distortion is calculated between the selected codevector and the residual vector, and, at step 170, this measure of distortion is compared to the threshold. If the measure of distortion exceeds the threshold, then the next level of the codebook is selected, as shown at step 172, and, unless the process has already been performed for the last level of the tree (step 174), steps 166 through 170 are repeated for this next level of the codebook. The loop defined by steps 166 through 174 is repeated, for each subsequent level of the codebook, until the measure of distortion between the selected codevector and the residual vector is less than the threshold (step 170), or until the last level of the tree has been compared (step 174). Step 174 recites "last level + 1" to indicate that the residual vector is encoded at the last level when the measure of distortion always exceeds the threshold, i.e., the loop is not exited until after encoding has been performed at the last level.

When a codevector has been finally selected (at either step 170 or step 174), its address, and the mean value associated with the current input vector, are Huffman encoded, as shown at step 176, and these Huffman codes are inserted into the buffer 118 as shown at step 178. The threshold value is thereafter adjusted as shown at step 180, and, when the Huffman codes for the current input vector have been clocked through the buffer 118, they are transmitted as shown at step 182.

As shown, the process is repeated for each input vector.

As shown in FIG. 8, in the preferred embodiment, the threshold is adjusted between the receipt of each new input vector. Since an image is generally represented by a plurality of input vectors, the method shown in FIG. 8 may adjust the magnitude of the threshold value many times for a single image frame. However, if desired, the threshold value may be adjusted only between image frames. Thus, it may be desired to adjust the threshold only in-between the time that a last input vector for one image frame and a first input vector for a subsequent image frame are received.

Figure 9:
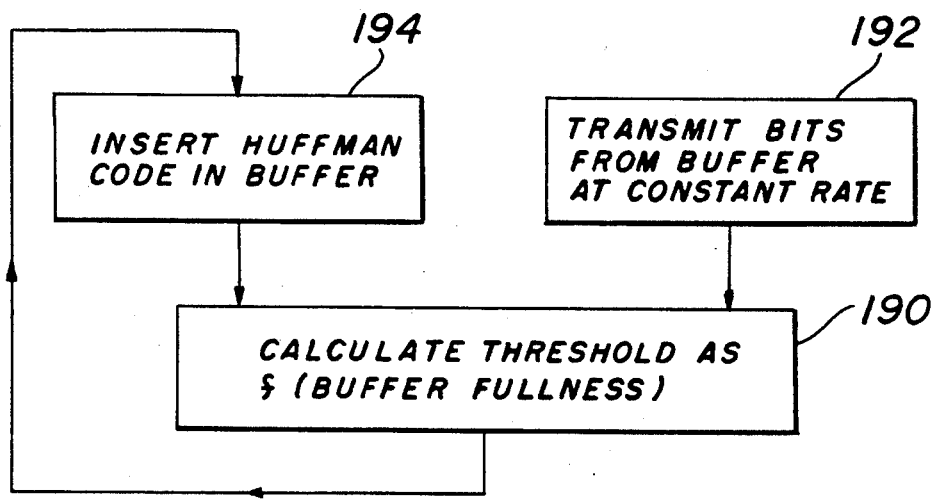
FIG. 9 is a flowchart illustrating further details of the operation of the apparatus of FIG. 7.

FIG. 9 illustrates, in flowchart form, how the threshold value is adjusted according to the preferred embodiment of the invention. As Huffman codes (or variable rate addresses) are inserted into the buffer 118 (step 194), and also as serial data is transmitted out of the buffer at a fixed data rate (step 192), the threshold is recalculated as a function of buffer fullness. As previously mentioned, however, the threshold value provided to the controller 108 and the calculator 106 is adjusted only in-between receipt of input vectors.

As an alternative, the value of the threshold can be determined for one or more images. In this case, the value of the threshold is chosen by the encoder which causes those particular frames to generate the required fixed amount of data to match the transmission channel capacity. The value of the threshold can be found by the encoder, for example, using trial and error or an iterative search technique.

As mentioned, data bits are serially transmitted from the buffer 118.

Figure 10:
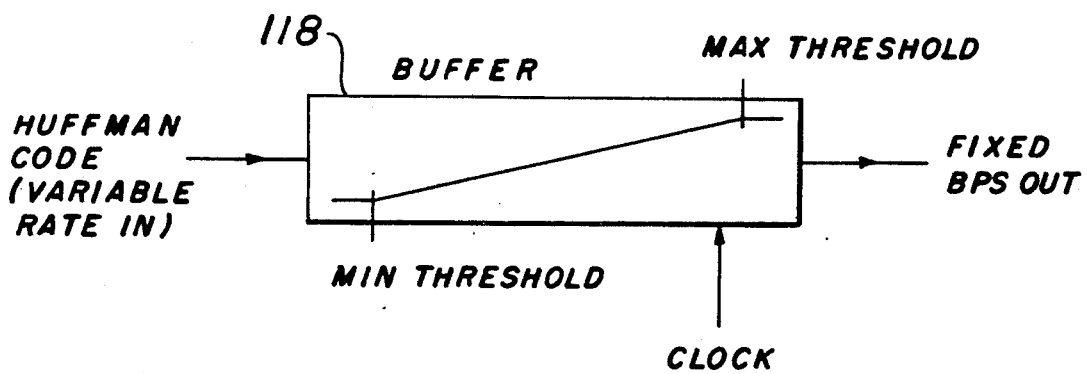
FIG. 10 is a block diagram illustrating further details of the apparatus of FIG. 7 and the method of FIG. 8.

FIG. 10 graphically illustrates the concept of employing buffer fullness to adjust the threshold value. As shown, remaining buffer capacity varies as a function of the length of the variable rate input data (either the Huffman codes or the variable rate addresses), since data is transmitted from the buffer 118 at a fixed data rate. As shown by the line inside the buffer 118 of FIG. 10, the threshold value increases toward a maximum as unused capacity decreases, and the threshold value decreases toward a minimum as unused buffer capacity increases. Theoretical considerations for establishing minimum and maximum threshold values are:

---
Min threshold = 0;
Max threshold = absolute value of [maxpix - minpix]* numpix;
or,
Max threshold = [maxpix - minpix]$^2$ * numpix;
where: maxpix = maximum grey level of pixels;
minpix = minimum grey level of pixels;
numpix = block (sub-image) size
---

However, in practice, max threshold can be set to a value smaller than the theoretical maximum since the theoretical value is not likely to ever occur. This ensures better buffer utilization without requiring an excessively large buffer.

Figure 11:
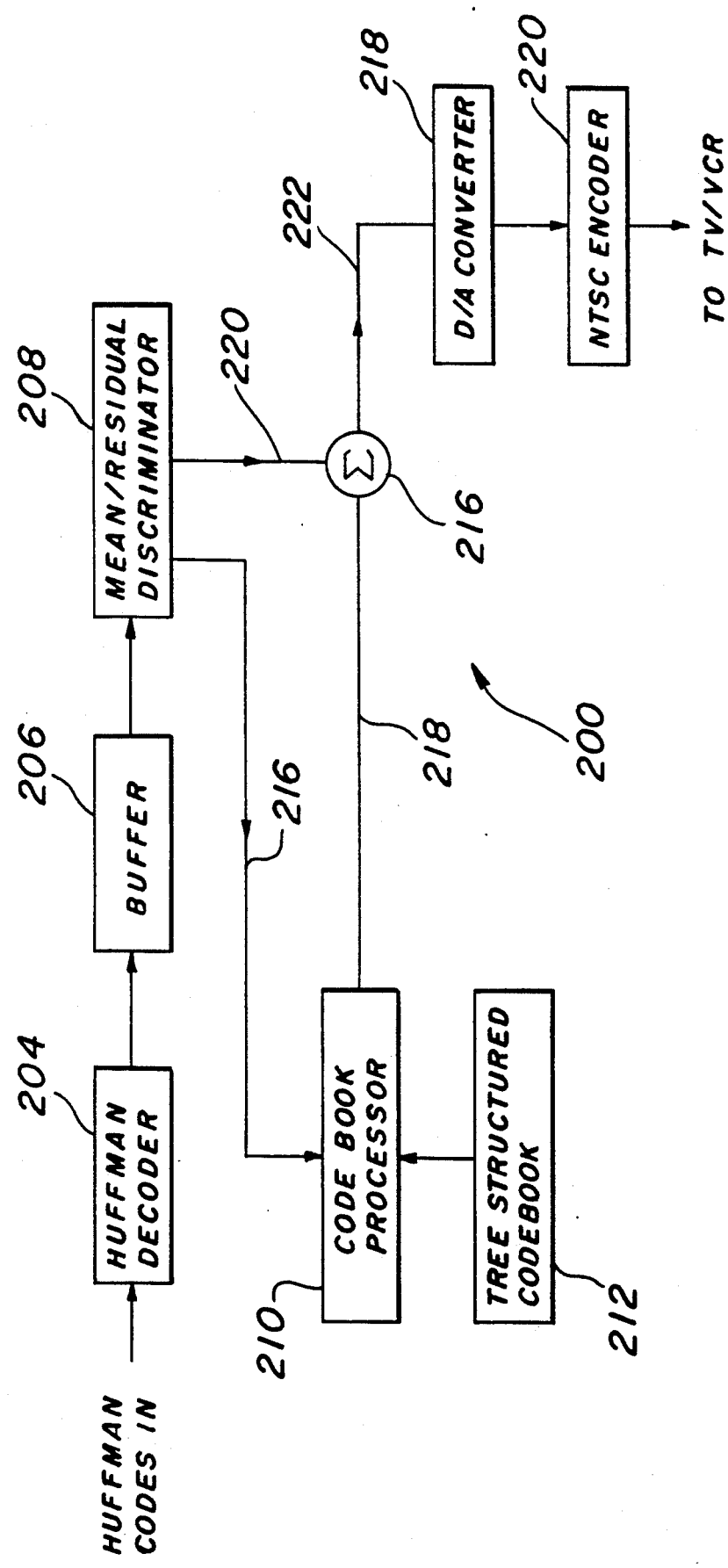
FIG. 11 is a block diagram of one embodiment of a decoder apparatus for carrying out vector quantization decompression according to the present invention.

Referring now to FIG. 11, there is shown a block diagram of an apparatus (decoder) for receiving VQ data transmitted by the buffer 118 and converting the same back to image data. The apparatus of FIG. 11 may be employed to implement blocks 28, 38 and 52 of FIGS. 1 and 2.

As shown, a Huffman decoder 206 receives and decodes the received data to obtain the transmitted address and mean value. These are stored, preferably on a per frame basis, in a buffer 206. In one preferred implementation, these data are stored for both the complete current frame and the complete immediately preceding frame so that interpolated mean values can be computed. A discriminator circuit 208 retrieves the obtained address and provides it on a line 216 to a codebook processor 210 that may be identical to the codebook processor 112 of FIG. 7. The apparatus 200 of FIG. 11 is also provided with a tree structured codebook 212 which is identical to the tree structured codebook 114 of the encoder apparatus 100 of FIG. 7. The address on line 216 provided by the discriminator circuit 208 is employed by the codebook processor to retrieve the identical codevector which was found to be the best match by the encoder 100 of FIG. 7. This codevector, which represents a residual codevector, is supplied on a line 218, to the input of a summing circuit 216. The discriminator 208 supplies the mean value to another input of the summer 216 via line 220. The summer adds the mean value to the residual codevector to supply, on line 222, a reproduced codevector which is a substantial representation, in the form of a digital value, of the corresponding input vector processed by the encoder 100 of FIG. 7. Each digital value is then converted to analog form and NTSC encoded and supplied to the input of a TV or VCR as hereinbefore described.

Figure 12:
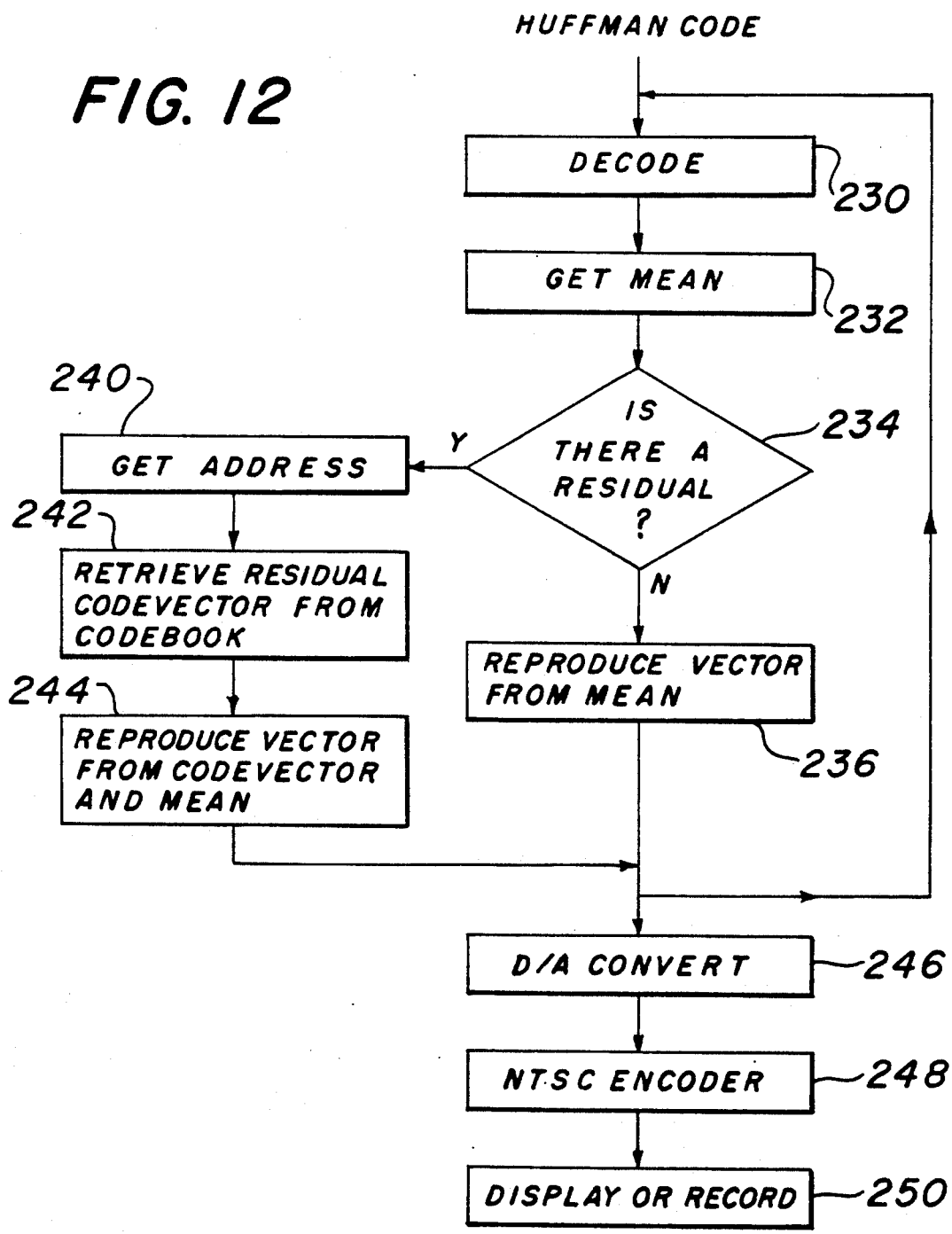
FIG. 12 is a flowchart illustrating the operation of the apparatus of FIG. 11.

FIG. 12 is a flowchart illustrating the operation of the circuit of FIG. 11. As shown, each received Huffman code is decoded by circuit 204, as shown at step 230. The mean value is retrieved, step 232, then, at step 234, a determination is made as to whether the codebook address of a corresponding residual vector was transmitted with this mean value. As previously mentioned, this may be determined by appending a code to the mean value at the encoder when its transmission is not accompanied by a codebook address (the Huffman encoder will do this automatically). If, at step 234, it was determined that a codebook address did not accompany this mean value, then, as shown at step 236, the vector is reproduced solely from the mean value.

If, at step 234, it was determined that a codebook address did accompany the transmission of the mean value, then that codebook address is retrieved as shown at step 240. Then, as shown at step 242, the residual codevector residing at this address in the codebook 212 of the decoder 200 is retrieved. As shown at 244, a vector is reproduced by adding the mean value back to the residual codevector. When an image vector has been received, its digital values are converted to analog form (step 246) and NTSC encoded at step 248. Thereafter, the NTSC image data may be displayed on a TV, or recorded on a VCR, as desired.

In FIGS. 11 and 12, the reproduced image vector is shown as being supplied directly to the D/A converter 218. However, this illustration is simplified and is for purposes of expediency only. Those skilled in the art will readily appreciate that a full scan line will need to be obtained, i.e., from several sequential image vectors, for the NTSC encoder to trace a line of the image on the display or recording device. This may be performed by employing a small buffer to store those sequential image vectors needed to construct a scan line. An alternative method of retrieving a scan line is disclosed in co-pending patent application Ser. No. 07/794,487, entitled "Method and Apparatus For Low Frequency Removal in Vector Quantization."

The invention has been described above as being carried out in the spatial domain, i.e., the codevectors stored in the codebook are representative of the spatial placement of the pixels in each sub-image, and the input vectors used to search the codebook are representative of the spatial placement of an actual group of pixels. However, the invention is not limited to implementation in the spatial domain. The invention may also be carried out in the transform, or frequency, domain wherein, instead of storing spatial codevectors as above described, their transforms are calculated and transformed codevectors are stored in the codebook. For example, each codevector would be replaced by its cosine (Fourier) transform, and each input vector would be transformed prior to searching the codebook. In this case, the codebook would still be constructed as described in the above mentioned Linde et al. reference, but entries would be based upon a distance metric (e.g., mean square error) in the transformed vector space. Thus, in the encoder, the tree search would be carried out in the transform domain. However, the decoder could remain unchanged. The decoder codebook could continue to operate in the spatial domain. The advantage of this approach is that it is believed that it would result in fewer "block" artifacts commonly found in VQ encoder/decoder schemes.

The present invention may be employed in other specific forms without departing from the spirit or essential attributes thereof and, accordingly, reference should be made to the appended claims rather than to the foregoing specification, as indicating the scope of the invention.

We claim:

1. In a vector quantization data compression system employing a tree search vector quantization codebook having plural levels of codevectors representative of possible input vectors to be processed by the system, each input vector being indicative of a block of data to be compressed, each codevector having an associated identification (ID) code, a method comprising the steps of:
   a) receiving an input vector and determining a mean value of the received input vector;
   b) transmitting data indicative of the mean value;
   c) determining a difference value indicative of a difference between the input vector and the mean value, and comparing the difference value to a threshold value;
   d) performing the following additional steps when the difference value exceeds the threshold value:
      (i) selecting a codevector from the codebook based upon a processed version of the input vector and the threshold value; and,
      ii) transmitting data indicative of the ID code associated with the selected codevector.

2. Method according to claim 1 wherein the codevectors are stored in a memory and each ID code is a memory address.

3. Method according to claim 2 wherein the addresses have a variable length that increases with each level of codevectors and wherein, on average, the length of the addresses is shorter than a length of the codevectors, and step (d)(ii) comprises transmitting the variable length address.

4. Method according to claim 2 wherein a compression code is assigned to each possible address, each compression code having a length that is substantially inversely proportional to a predetermined probability that a particular codevector will be selected in step (d)(i), and step (d)(ii) comprises transmitting the compression code for the address associated with the selected codevector.

5. Method according to claim 1 further comprising the step of periodically adjusting the threshold value based upon an average length of data transmitted in steps (b) and (d)(ii).

6. Method according to claim 3 or 4 wherein the data to be transmitted is temporarily stored then transmitted at a substantially fixed data rate.

7. Method according to claim 1 wherein the system receives input data to be compressed and the input data is representative of a moving image.

8. Method according to claim 1 wherein, prior to performing step (d), the mean value is removed from the input vector to obtain a residual vector, and the residual vector is employed to select the codevector in step (d)(i), the residual vector being the said processed version of the input vector.

9. Method according to claim 8 wherein step (d)(i) comprises:
   a') selecting an initial level of the codebook;
   b') selecting the codevector at the selected level that most closely resembles the residual vector;
   c') obtaining a measure of difference, if any, between the selected codevector and the residual vector;
   d') proceeding to step (d)(ii) only if the measure of difference is less than the threshold value, but otherwise selecting a next level of the codebook and repeating steps (b') and (c') until either the measure of difference is less than the threshold value or a last level of the codebook has been employed, then proceeding to step (d)(ii).

10. Method according to claim 4 wherein the compression codes are Huffman codes.

11. In a tree search, variable rate vector quantization data compression system of the type that converts a block of input data to a multi-dimensional input vector, and having a codebook with plural levels of codevectors, each codevector being representative of a possible input vector for converting each input vector to an identification (ID) code associated with each codevector, the codevectors at each successive level representing possible input vectors with greater accuracy than codevectors at a preceding level, a method comprising the steps of:
   a) processing the input vector and selecting an initial level of the codebook;
   b) comparing the processed vector to the codevectors at the selected level of the codebook and selecting the codevector that most closely resembles the processed vector;
   c) obtaining a measure of difference, if any, between the processed vector and the selected codevector;
   d) transmitting an indication of the ID code associated with the selected codevector only if the measure of difference is less than a threshold value, but otherwise selecting a next level of the codebook and repeating steps (b) and (c) until either the measure of difference is less than the threshold value or a last level of the codebook is reached, then transmitting the indication, each ID code having a length that, on average, is shorter than a length of its associated codevector.

12. Method according to claim 11 wherein step (a) comprises determining a mean value of each input vector and removing the mean value from the input vector to obtain a residual vector, the processed vector comprising the residual vector.

13. Method according to claim 11 wherein the codebook is stored in a memory and each ID code is a memory address and the memory addresses have a variable length wherein the length increases with each successive level of codevectors, the transmitted indication identifying the variable length address of a finally selected codevector and the level of the finally selected codevector.

14. Method according to claim 11 wherein the codebook is stored in a memory and each ID code is a memory address, and a compression code is assigned to each possible address, each compression code having a length that is substantially inversely proportional to a predetermined probability that a particular codevector will be finally selected, the transmitted indication comprising the compression code for the address associated with the finally selected codevector.

15. Method according to claim 14 wherein the compression codes are Huffman codes.

16. Method according to claim 13 or 14 further comprising the step of automatically adjusting the threshold based upon a measure of average length of previously transmitted indications.

17. Method according to claim 13 or 14 wherein the indications are transmitted at a fixed data rate, further comprising the steps of storing indications to be transmitted in a buffer, periodically obtaining a measure of unused capacity of the buffer, and automatically adjusting the threshold value based upon the measure of unused buffer capacity.

18. Method according to claim 12 wherein the following steps (i) and (ii) are performed prior to performing steps (b)-(d):
  i) obtaining a measure of difference between the mean value and the input vector; and,
  ii) comparing the measure of difference from step (i) to the threshold value;
  and wherein steps (b)-(d) are performed only if the result of the comparison of step (ii) indicates that the measure of difference from step (i) is greater than the threshold value;
  and further comprising the step of always transmitting an indication of the mean value of each received input vector.

19. Method according to claim 18 further comprising the step of compressing both the ID code associated with the finally selected codevector and the mean value according to a lossless compression technique, the transmitted indication comprising both the compressed ID code and the compressed mean value.

20. Method according to claim 19 wherein the compression technique is a Huffman encoding technique.

21. Method according to claim 11 wherein the input data comprises image frames representing moving images to be displayed on a television set, each image frame comprising a matrix of pixels and each pixel within each image frame having at least an associated intensity value, and at least ones of the input vectors are representative of the intensity values of a block of pixels in the image.

22. Method according to claim 11 wherein the input data comprises image frames representing moving images to be displayed on a television set, each image frame comprising a matrix of pixels and each pixel within each image frame having at least associated luminance and chrominance values, and at least ones of the input vectors are representative of the luminance and chrominance values of a block of pixels in the image.

23. Method according to claim 16 wherein the input data comprises temporally spaced image frames representing a moving image and the threshold is adjusted only between image frames.

24. Method according to claim 17 wherein the input data comprises temporally spaced image frames representing a moving image and the threshold is adjusted only between image frames.

25. Method according to claim 16 wherein the input data comprises temporally spaced image frames representing a moving image and the threshold is periodically adjusted within image frames.

26. Method according to claim 17 wherein the input data comprises temporally spaced image frames representing a moving image and the threshold is periodically adjusted within image frames.

27. Method according to claim 21 further comprising the steps of:
  providing another substantially identical tree search vector quantization codebook at a locale of the television set;
  receiving each transmitted indication at the locale of the television set, obtaining the ID code therefrom, and retrieving from the codebook at the locale of the television set the codevector associated with the obtained ID code to reproduce at least a substantial representation of the finally selected codevector;
  employing each reproduced finally selected codevector to substantially re-create each image frame at the locale of the television set and display each re-created image frame on the television set.

28. Method according to claim 27 wherein the data is transmitted via satellite to a reception site then retransmitted at the reception site over a cable television distribution network to a plurality of cable television subscribers.

29. Method according to claim 27 wherein the data is transmitted via satellite directly to a reception site comprising one of a free television broadcast recipient, a cable head end, a reception location of a cable television distribution system, or a pay television subscriber.

30. Method according to claim 21 wherein the data is transmitted via satellite to a reception site and the following steps are performed at the reception site:
  providing another substantially identical tree search vector quantization codebook at a locale of the reception site;
  receiving each transmitted indication at the locale of the reception site, obtaining the ID code therefrom, and retrieving from the codebook at the locale of the reception site the codevector associated with the obtained ID code to reproduce at least a substantial representation of the finally selected codevector;
  employing each reproduced finally selected codevector to substantially re-create each image frame at the locale of the reception site and encoding data for each re-created image frame in NTSC format;
  transmitting the NTSC encoded data from the reception site to a plurality of cable television subscribers over a cable television distribution network.

31. In a data compression system of the type converting input data to multi-dimensional input vectors each representing a block of data, a method comprising:
  a) determining a mean value of each input vector and, transmitting data indicative of the mean value;
  b) providing, in a memory, a tree-search vector quantization codebook having plural levels of codevectors, there being a residual vector defined by each input vector, each codevector being representative of a possible residual vector and each successive level of codevectors representing possible residual vectors with greater accuracy than a preceding level of codevectors, there being a memory address associated with each codevector;
  c) obtaining a measure of difference between the mean value and the input vector and comparing the measure of difference to a threshold value and performing the following additional steps only if the measure of difference exceeds the threshold value;
  d) removing the mean value from the vector to obtain the residual vector defined by the input vector and selecting an initial level in the codebook;
  e) comparing the residual vector to the codevectors at the selected level and selecting the codevector at the selected level that most closely resembles the residual vector;
  f) calculating a distortion value representative of a difference, if any, between the selected codevector and the residual vector, and comparing the distortion value to the threshold value;
  g) selecting the next level in the codebook if the distortion value exceeds the threshold value and repeating steps (e) and (f) until either (1) the distortion value does not exceed the threshold value, or (2) a last level of the codebook has been reached, to obtain a finally selected codevector; and, h) transmitting an indication of at least the address associated with the finally selected codevector, each transmitted indication having a length that is on average shorter than a length of the finally selected codevector.

32. Method according to claim 31 wherein the addresses have variable length that increases with each successive level of codevectors, the transmitted indication identifying both the variable length address and level of the finally selected codevector.

33. Method according to claim 31 wherein step (h) comprises compressing the address associated with the finally selected codevector according to a lossless compression technique then transmitting the compressed address, the transmitted indication comprising the compressed address.

34. Method according to claim 33 wherein the address is compressed according to a Huffman encoding technique.

35. Method according to claim 31 wherein step (a) comprises compressing the mean value according to a lossless compression technique then transmitting the compressed mean value, the transmitted data indicative of the mean value comprising the compressed mean value.

36. Method according to claim 31 wherein both the address associated with the finally selected codevector and the mean value are compressed according to a lossless compression technique, and step (a) comprises transmitting the compressed mean value and step (g) comprises transmitting the compressed address.

37. Method according to claim 35 wherein the mean value is compressed according to a Huffman encoding technique.

38. Method according to claim 31 wherein, prior to performing step (h), a compression code is assigned to each possible address, each compression code having a length that is substantially inversely proportional to a predetermined probability that a particular codevector will be finally selected, the transmitted indication comprising the compression code for the address associated with the finally selected codevector.

39. Method according to claim 38 wherein the compression codes are Huffman codes.

40. Method according to claim 31, 32 or 38 wherein the indications are transmitted at a substantially fixed data rate.

41. Method according to claim 40 further comprising the step of storing indications to be transmitted in a buffer, periodically obtaining a measure of unused capacity of the buffer, and periodically and automatically adjusting the threshold value based upon the measure of unused capacity of the buffer.

42. Method according to claim 41 wherein the threshold value is adjusted by increasing the threshold value when the measure indicates that unused buffer capacity is decreasing and decreasing the threshold value when the measure indicates that unused buffer capacity is increasing, adjustment of the threshold value ensuring that the buffer does not empty or overflow.

43. Method according to claim 31 wherein the input data comprises image frames representing moving images to be displayed on a television set, each image frame comprising a matrix of pixels and each pixel within each image frame having at least an associated intensity value, and at least ones of the input vectors are representative of the intensity values of a block of pixels in the image.

44. Method according to claim 31 wherein the input data comprises image frames representing moving images to be displayed on a television set, each image frame comprising a matrix of pixels and each pixel within each image frame having at least associated luminance and chrominance values, and at least ones of the input vectors are representative of the luminance and chrominance values of a block of pixels in the image.

45. Method according to claim 31 wherein the input data comprises temporally spaced image frames representing a moving image and the threshold is adjusted only between image frames.

46. Method according to claim 41 wherein the input data comprises temporally spaced image frames representing a moving image and the threshold is adjusted only between image frames.

47. Method according to claim 41 wherein the input data comprises temporally spaced image frames representing a moving image and the threshold is periodically adjusted within image frames.

48. Method according to claim 43 further comprising the steps of:
   providing another substantially identical tree search vector quantization codebook at a locale of the television set;
   receiving each transmitted indication at the locale of the television set, obtaining the address therefrom, and retrieving from the codebook at the locale of the television set the codevector residing at the obtained address to reproduce at least a substantial representation of the finally selected codevector;
   employing each reproduced finally selected codevector to substantially re-create each image frame at the locale of the television set and display each recreated image frame on the television set.

49. Method according to claim 48 wherein the data is transmitted via satellite to a reception site then retransmitted at the reception site over a cable television distribution network to a plurality of cable television subscribers.

50. Method according to claim 48 wherein the data is transmitted via satellite directly to a pay television subscriber.

51. Method according to claim 43 wherein the data is transmitted via satellite to a reception site and the following steps are performed at the reception site:
   providing another substantially identical tree search vector quantization codebook at a locale of the reception site;
   receiving each transmitted indication at the locale of the reception site, obtaining the address therefrom, and retrieving from the codebook at the locale of the reception site the codevector associated with the obtained address to reproduce at least a substantial representation of the finally selected codevector;
   employing each reproduced finally selected codevector to substantially re-create each image frame at the locale of the reception site and encoding data for each re-created image frame in NTSC format;
   transmitting the NTSC encoded data from the reception site to a plurality of cable television subscribers over a cable television distribution network.

52. Variable rate vector quantization data compression method comprising the steps of:

a) receiving data indicative of an image to be compressed, organizing the image data into blocks, and converting each block to a multi-dimensional input vector;

b) determining a mean value of the input vector;

c) assigning a compression code to the mean value according to a lossless compression technique and storing the compression code in a first-in first-out (FIFO) buffer;

d) providing, in a memory, a tree-search vector quantization codebook having plural levels of codevectors, there being a residual vector defined by each input vector, each codevector being representative of a possible residual vector and each successive level of codevectors representing the possible residual vectors in greater detail than a preceding level of codevectors, there being a memory address associated with each codevector;

e) assigning a compression code to each possible address, each compression code having a length that is substantially inversely proportional to a predetermined likelihood that the codevector associated with the address corresponding to the compression code will be selected;

f) obtaining a measure of difference between the input vector and the mean value and comparing the measure of difference to a threshold value and performing steps (f1) through (f5) below only if the measure of difference exceeds the threshold value;

f1) removing the mean value from the input vector to obtain the residual vector defined by the input vector and selecting an initial level in the codebook;

f2) comparing the residual vector to the codevectors at the selected level and selecting the codevector that most closely resembles the residual vector;

f3) obtaining a measure of difference, if any, between the selected codevector and the residual vector, and comparing the measure of difference between the selected codevector and the residual vector to the threshold value;

f4) selecting the next level in the codebook if the measure of difference obtained in step (f3) exceeds the threshold value;

f5) repeating steps (f1) through (f4) until either (1) the measure of difference does not exceed the threshold value, or (2) a last level of the codebook has been reached, to obtain a finally selected codevector and storing the compression code for the address of the finally selected codevector in the FIFO buffer;

g) repeating steps (b) through (f) for each new input vector while sequentially transmitting each compression code stored in the FIFO buffer at a fixed data rate; and, h) maintaining a measure of unused FIFO buffer capacity and periodically adjusting the threshold value by automatically increasing the threshold value when the measure of unused FIFO buffer capacity indicates that unused capacity is decreasing and automatically decreasing the threshold value when the measure of unused FIFO buffer capacity indicates that unused capacity is increasing, adjustment of the threshold value ensuring that the buffer does not empty or overflow as a result of storing variable length compression codes but transmitting the same at a fixed data rate.

53. Method according to claim 52 wherein the compression codes are Huffman codes.

54. Method according to claim 52 wherein the image is represented by a matrix of pixels each having at least an intensity value and the received data is digital data indicative of at least the intensity value of each pixel, and further wherein at least ones of the input vectors comprise digital intensity data for a rectangular block of pixels.

55. Method according to claim 52 wherein the image is represented by a matrix of pixels in an image frame and the images are color images, each pixel within each image frame having at least associated luminance and chrominance values, at least ones of the input vectors being representative of the luminance and chrominance values of a block of pixels in the image.

56. Method according to claim 52 wherein the image is a moving image represented by sequential image frames and data indicative of sequential frames is captured in frame buffers, and the received data corresponds to data stored in each frame buffer, and wherein the threshold value is adjusted only between receipt of the data for each sequential frame.

57. Method according to claim 54 wherein the indications are transmitted to a cable television subscriber further comprising the steps of:

providing another substantially identical tree search vector quantization codebook at a locale of the cable television subscriber;

receiving each transmitted indication at the locale of the cable television subscriber, obtaining the address therefrom, and retrieving from the codebook at the locale of the cable television subscriber the codevector residing at the obtained address to reproduce at least a substantial representation of the finally selected codevector;

employing each reproduced finally selected codevector to substantially re-create each image frame at the locale of the cable television subscriber and display each re-created image frame on a television set of the cable television subscriber.

58. Method according to claim 57 wherein the data is transmitted via satellite to a reception site then retransmitted at the reception site over a cable television distribution network to the cable television subscriber.

59. Method according to claim 54 wherein the data is transmitted via satellite directly to a pay television subscriber further comprising the steps of:

providing another substantially identical tree search vector quantization codebook at a locale of the pay television subscriber;

receiving each transmitted indication at the locale of the pay television subscriber, obtaining the address therefrom, and retrieving from the codebook at the locale of the pay television subscriber the codevector residing at the obtained address to reproduce at least a substantial representation of the finally selected codevector;

employing each reproduced finally selected codevector to substantially re-create each image frame at the locale of the pay television subscriber and display each re-created image frame on a television set of the pay television subscriber.

60. Method according to claim 54 wherein the data is transmitted via satellite to a reception site and the following steps are performed at the reception site:

providing another substantially identical tree search vector quantization codebook at a locale of the reception site;

receiving each transmitted indication at the locale of the reception site, obtaining the address therefrom, and retrieving from the codebook at the locale of the reception site the codevector associated with the obtained address to reproduce at least a substantial representation of the finally selected codevector to reproduce at least a substantial representation of the finally selected codevector;

employing each reproduced finally selected codevector to substantially re-create each image frame at the locale of the reception site and encoding data for each re-created image frame in NTSC format;

transmitting the NTSC encoded data from the reception site to a plurality of cable television subscribers over a cable television distribution network.

61. In a cable television system, a method of communicating temporally spaced image frames representing moving images to be displayed on a subscriber set, each image frame comprising a matrix of pixels and each pixel within each image frame having at least an associated intensity value, the method comprising the steps of:

a) digitizing the intensity values for the pixels within each image frame and formatting the digital intensity values corresponding to a rectangular block of pixels within the image frame to a multi-dimensional input vector;

b) processing the input vector;

c) providing, in a memory located at a transmitter location of cable television signals, a first tree-search vector quantization codebook having plural levels of codevectors each representative of a possible processed vector for converting each processed vector to a memory address associated with each codevector, the codevectors at each successive level representing possible processed vectors in greater detail than codevectors at a preceding level;

d) selecting an initial level in the codebook;

e) comparing each processed vector to the codevectors at the selected level and selecting the codevector at the selected level that most closely resembles the processed vector;

f) calculating a measure of difference, if any, between the selected codevector and the processed vector, and comparing the measure of difference to a threshold value;

g) selecting the next level in the codebook if the measure of difference exceeds the threshold value and repeating steps (e) and (f) until either (1) the measure of difference does not exceed the threshold value, or (2) a last level of the codebook has been reached, to obtain a finally selected codevector;

h) temporarily storing indications of at least addresses associated with finally selected codevectors, the indications having lengths that are variable and on average shorter than lengths of the finally selected codevectors;

i) serially transmitting the stored indications at a substantially fixed data rate; and, j) automatically adjusting the threshold value based upon a condition of the stored indications only either (1) between image frames or (2) within image frames to ensure that storage and subsequent transmission of the indications does not result in an empty or overflow storage condition as a result of storing variable length indications and transmitting the same at a fixed data rate.

62. Method according to claim 61 wherein the indications are transmitted to a plurality of cable television subscribers, further comprising the steps of:

k) providing a second tree search vector quantization codebook at a locale of each cable television subscriber, each second codebook having a structure and content, including codevectors, substantially identical to that of the first codebook;

l) receiving each transmitted indication at the locale of each cable television subscriber, obtaining the address therefrom, and retrieving from the second codebook the codevector residing at the obtained address to reproduce at least a substantial representation of the finally selected codevector;

m) employing each reproduced finally selected codevector to substantially re-create each image frame at the locale of each cable television subscriber and display each re-created image frame on a television set of each cable television subscriber.

63. Method according to claim 62 wherein step (b) comprises determining a mean value of each input vector and removing the mean value from each input vector to obtain a residual vector, and the residual vector is employed in carrying out steps (e) and (f), and step (i) further comprises transmitting an indication of the mean value.

64. Method according to claim 63 wherein the reproduced finally selected codevector is a reproduced residual vector and step (l) further comprises receiving the transmitted indication of the mean value and combining the received indication of mean value and reproduced residual vector to substantially reproduce a representation of the input vector.

65. Method according to claim 61 wherein the images are color images and each pixel further has associated color data, and step (a) further comprises digitizing the color data for the pixels within each image frame and formatting the digital color data corresponding to the rectangular block of pixels within the image frame to another multi-dimensional input vector.

66. Method according to claim 61 wherein the memory addresses have a variable length wherein the length increases with each successive level of codevectors, the transmitted indication identifying the variable length address of a finally selected codevector and the level of the finally selected codevector.

67. Method according to claim 61 wherein a compression code is assigned to each possible address, each compression code having a length that is substantially inversely proportional to a predetermined probability that a particular codevector will be finally selected, the transmitted indication comprising the compression code for the address associated with the finally selected codevector.

68. Method according to claim 61 wherein the step (h) comprises temporarily storing the indications in a buffer and maintaining a measure of unused buffer capacity, and wherein the condition of the stored indications employed to adjust the threshold value is the measure of unused buffer capacity.

69. Data compression apparatus comprising:

a) first means for receiving a multi-dimensional vector representative of a block of data to be compressed;

b) a tree search vector quantization codebook having plural levels of codevectors, each codevector being representative of a possible vector and the codevectors at each successive level representing possible vectors in greater detail than codevectors at a preceding level, each codevector having a unique address associated therewith;

c) a controller for selecting one of the codevectors in the codebook based upon the vector and a measure of difference between the vector and a threshold value; and, d) second means for transmitting data indicative of the address of the selected codevector.

70. Apparatus according to claim 69 further comprising third means for temporarily storing data to be transmitted and for periodically adjusting the threshold value based upon a measure of unused capacity of the third means.

71. Apparatus according to claim 69 further comprising calculator means for determining a mean value of the vector and for removing the mean value from the vector to obtain a residual vector, the controller employing the residual vector to select the codevector, the second means further transmitting data indicative of the mean value.

72. Apparatus according to claim 70 further comprising a lossless compression encoder for assigning a compression code to the address of the selected codevector, the compression code having a length that is substantially inversely proportional to a probability that the selected address would actually be selected, the transmitted data comprising the compression code.

73. Apparatus according to claim 70 further comprising a feedback loop coupling the third means to the controller for supplying the threshold value.

74. Apparatus according to claim 70 wherein the data indicative of the selected address has variable length and wherein the third means comprises a first-in first-out (FIFO) buffer and further wherein the data indicative of the selected address is transmitted from an output of the FIFO at a fixed data rate.

75. Apparatus according to claim 69 wherein the data compression apparatus is embodied as a portion of a pay television encoder.

76. A decoder for use by subscribers of a pay television system employing, at an encoding site, a tree search vector quantization data compressor for compressing digital data indicative of at least intensity values of pixels of images to be transmitted to the subscribers by converting input vectors indicative of a block of pixels to addresses of a first codebook in the compressor, the first codebook having plural levels of codevectors representative of possible input vectors and each successive level representing codevectors with a greater accuracy than a preceding level of codevectors, the encoding site transmitting data indicative of addresses of codevectors found to most closely approximate input vectors, the decoder comprising:

a) a second codebook being substantially identical in content to the first codebook;

b) first means for receiving the transmitted data and for providing the received data in a form suitable for addressing the second codebook at an output thereof;

c) second means for selecting codevectors from the second codebook based upon the output of the first means; and, d) third means for converting the selected codevectors to NTSC image data and for providing the NTSC image data at an output thereof for substantially reproducing an image input to the encoding site.

77. Method according to claim 1, 11, 31, 52 or 61 wherein the codevectors are transformed to a transform domain before being provided in the codebook, and the codevectors are stored in the codebook in the transform domain, and wherein each input vector is transformed to the transform domain for selecting one of the codevectors from the codebook.

78. Method according to claim 77 wherein the transform domain is the frequency domain and the codevectors and input vectors are transformed to the frequency domain by a Fourier transform.

79. Method according to claim 11 or 31 wherein the input data comprises image frames and the indications are transmitted at a substantially fixed rate, further comprising the step of selecting a value for the threshold that causes a predetermined number of image frames to produce just a sufficient number of indications to yield the fixed rate over the predetermined number of frames.

80. Method according to claim 52 wherein the image data is in the form of image frames, further comprising the step of selecting a value for the threshold that causes a predetermined number of image frames to produce just a sufficient amount of compressed data to yield the fixed rate over the predetermined number of frames.

81. Method according to claim 61 further comprising the step of selecting a value for the threshold that causes a predetermined number of image frames to produce just a sufficient number of indications to yield the fixed rate over the predetermined number of frames.

82. Apparatus according to claim 69 wherein the input data comprises image frames and the indications are transmitted via the second means at a substantially fixed rate and wherein the threshold value has a magnitude that causes a predetermined number of image frames to produce just a sufficient number of indications to yield the fixed rate over the predetermined number of frames.

* * * * *